US011152134B2

(12) United States Patent
Yoon

(10) Patent No.: US 11,152,134 B2
(45) Date of Patent: Oct. 19, 2021

(54) FLEXIBLE FLAT CABLE

(71) Applicant: Hee Jun Yoon, Seoul (KR)

(72) Inventor: Sang bo Yoon, Bucheon-si (KR)

(73) Assignee: Hee Jun Yoon, Seoul (KR)

( * ) Notice: Subject to any disclaimer, the term of this patent is extended or adjusted under 35 U.S.C. 154(b) by 0 days.

(21) Appl. No.: 16/415,342

(22) Filed: May 17, 2019

(65) Prior Publication Data

US 2019/0279788 A1    Sep. 12, 2019

Related U.S. Application Data

(62) Division of application No. 15/969,339, filed on May 2, 2018, now Pat. No. 10,347,394, which is a division of application No. 15/436,105, filed on Feb. 17, 2017, now Pat. No. 10,008,304.

(30) Foreign Application Priority Data

Jul. 25, 2016   (KR) .................. 10-2016-0094120
Sep. 13, 2016   (KR) .................. 10-2016-0117929

(51) Int. Cl.
| | |
|---|---|
| *H01B 7/08* | (2006.01) |
| *H01B 7/295* | (2006.01) |
| *H01B 7/04* | (2006.01) |
| *H01B 7/282* | (2006.01) |
| *H03H 7/38* | (2006.01) |

(52) U.S. Cl.
CPC ............. *H01B 7/0838* (2013.01); *H01B 7/04* (2013.01); *H01B 7/295* (2013.01); *H03H 7/38* (2013.01)

(58) Field of Classification Search
CPC ...... H01B 7/0823; H01B 7/08; H01B 7/0838; H01B 7/04; H01B 7/295
See application file for complete search history.

(56) References Cited

U.S. PATENT DOCUMENTS

| | | | |
|---|---|---|---|
| 7,754,970 B2 | 7/2010 | Sasaki et al. | |
| 2007/0178751 A1 | 8/2007 | Yamamoto | |
| 2012/0181060 A1 | 7/2012 | Chen et al. | |
| 2012/0205138 A1* | 8/2012 | Kim | H01R 43/28 174/117 F |
| 2012/0267159 A1* | 10/2012 | Gundel | H01B 7/0838 174/350 |
| 2016/0005510 A1 | 1/2016 | Yoon | |
| 2016/0351296 A1 | 12/2016 | Gundel | |

FOREIGN PATENT DOCUMENTS

| | | |
|---|---|---|
| JP | 2014098087 A * | 5/2014 |
| WO | WO 2012/030364 A1 | 3/2012 |

* cited by examiner

*Primary Examiner* — Hoa C Nguyen
*Assistant Examiner* — Amol H Patel
(74) *Attorney, Agent, or Firm* — Birch, Stewart, Kolasch & Birch, LLP

(57) ABSTRACT

The present invention relates to a flexible flat cable including a plurality of conductive wires disposed between an upper film and a lower film, in which the conductive wires are fixed by a first thermal bonding resin of the upper film and a second thermal bonding resin of the lower film, an air gap is formed between the conductive wires, and a side end of the upper film and a side end of the lower film are bonded by the first thermal bonding resin and the second thermal bonding resin, and an impedance matching sheet is attached to a lower surface of the lower film, an upper portion of the upper film, or both the upper portion of the upper film and the lower surface of the lower film.

8 Claims, 32 Drawing Sheets

[FIG 1]
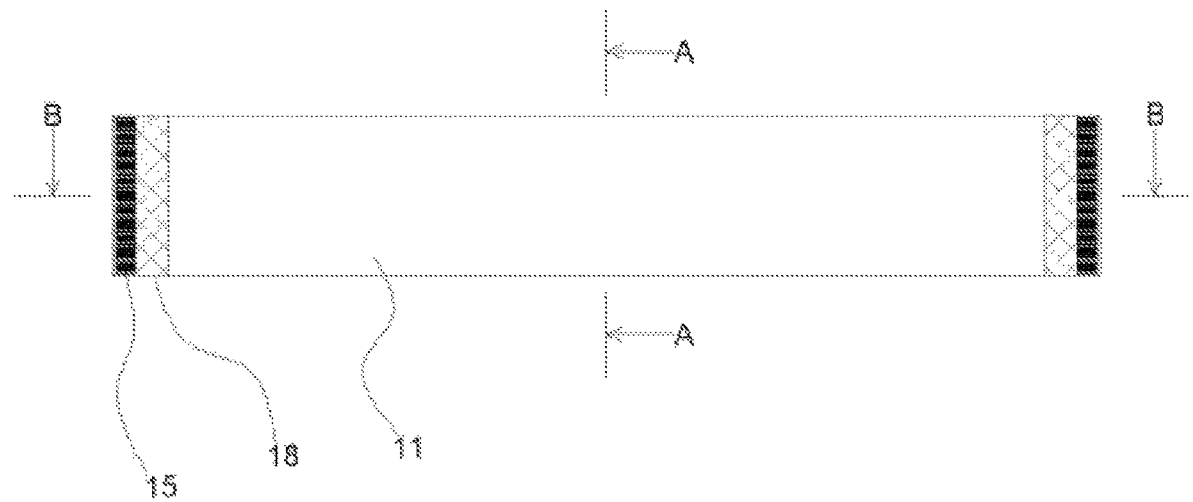
[FIG 2]
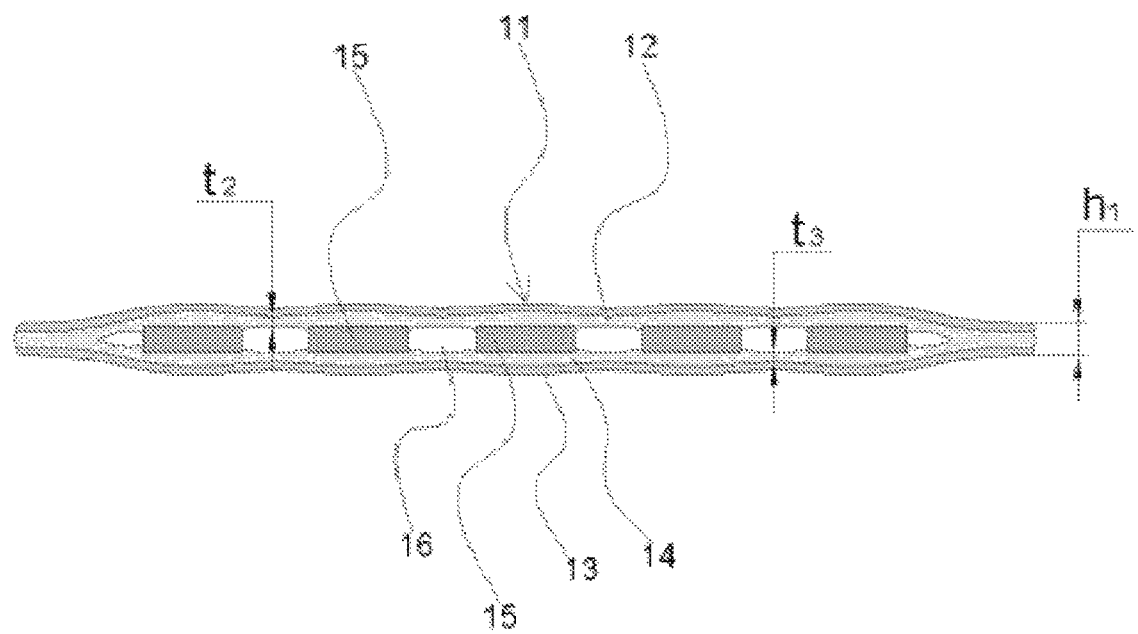

[FIG 3]
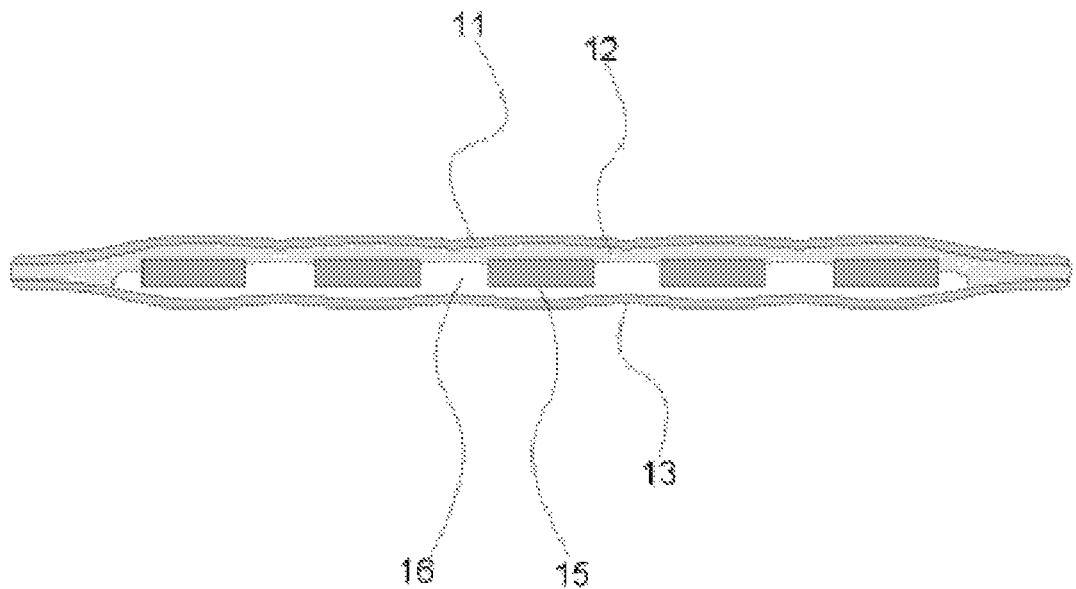
[FIG 4]
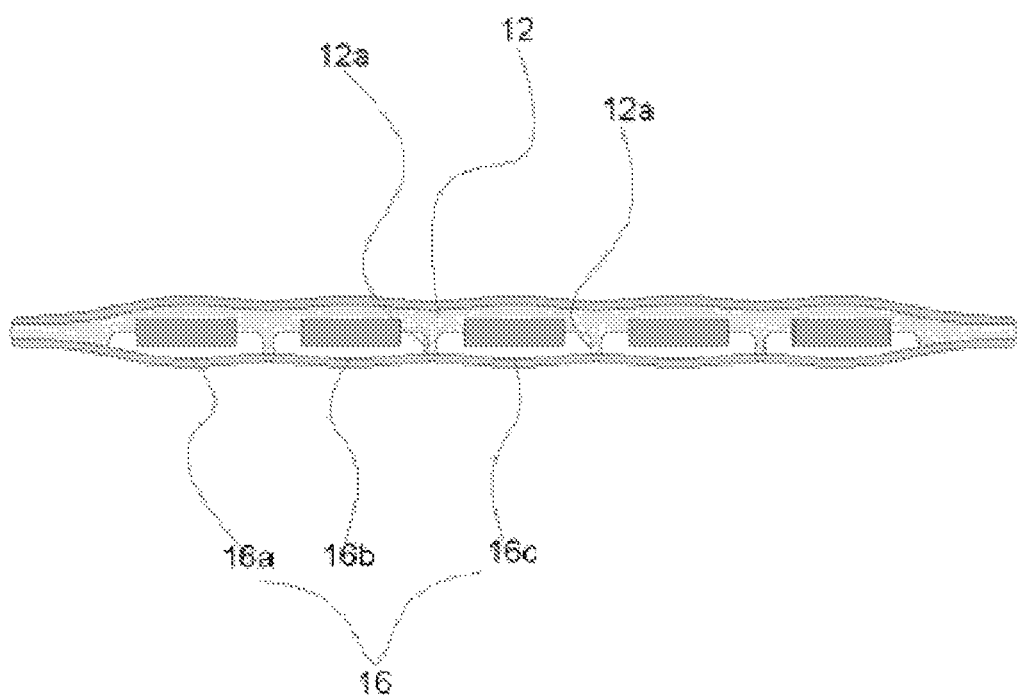

[FIG 5]
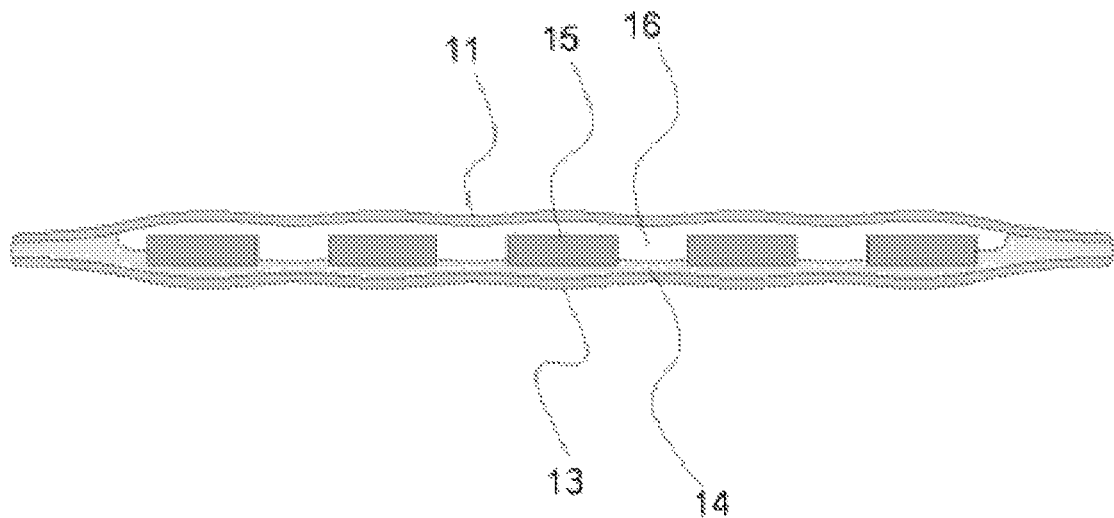
[FIG 6]
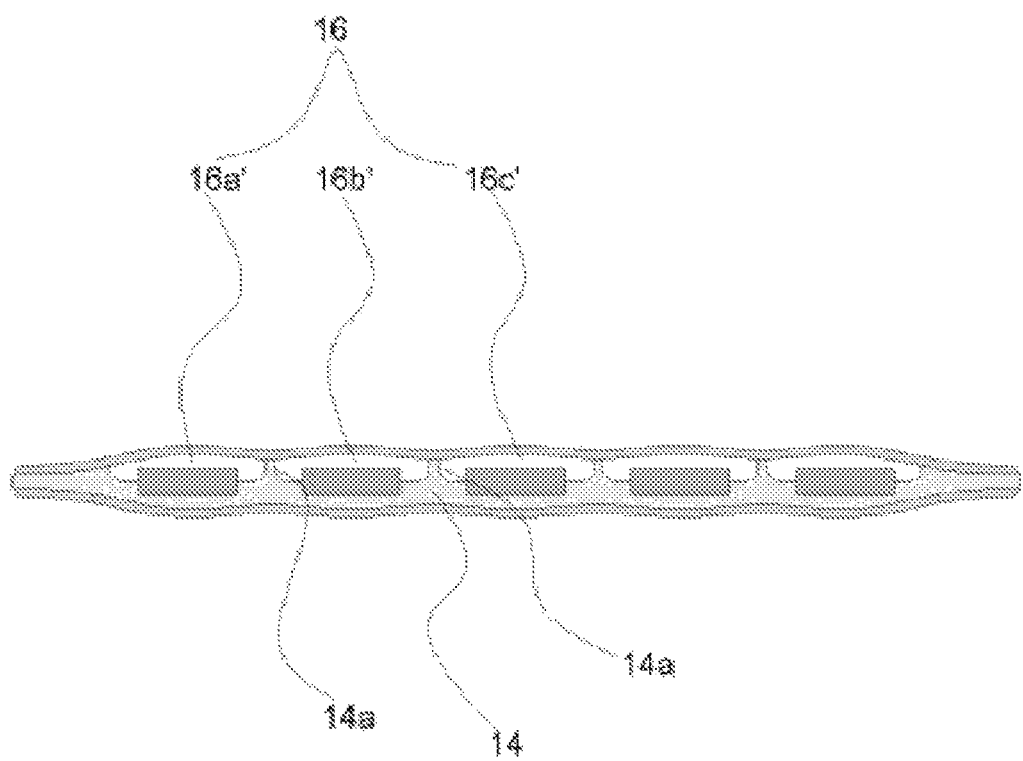

[FIG 7]
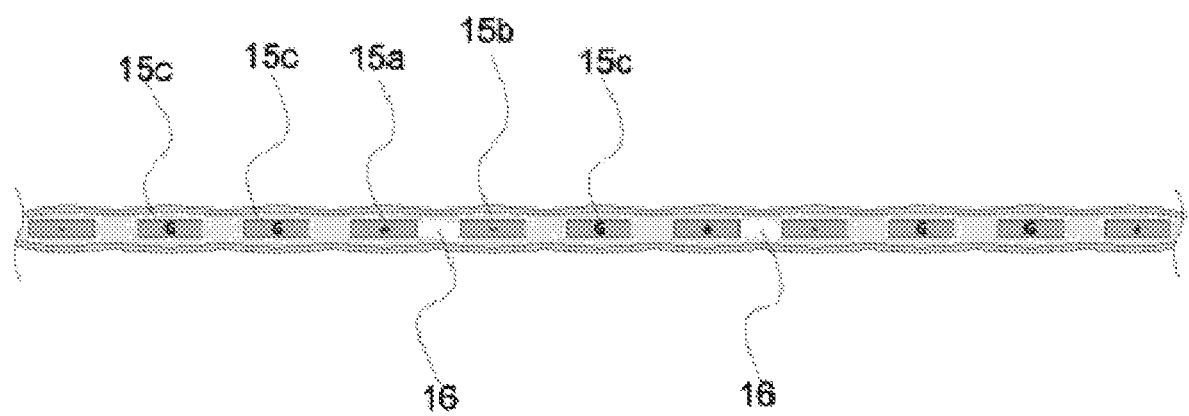

[FIG 8]
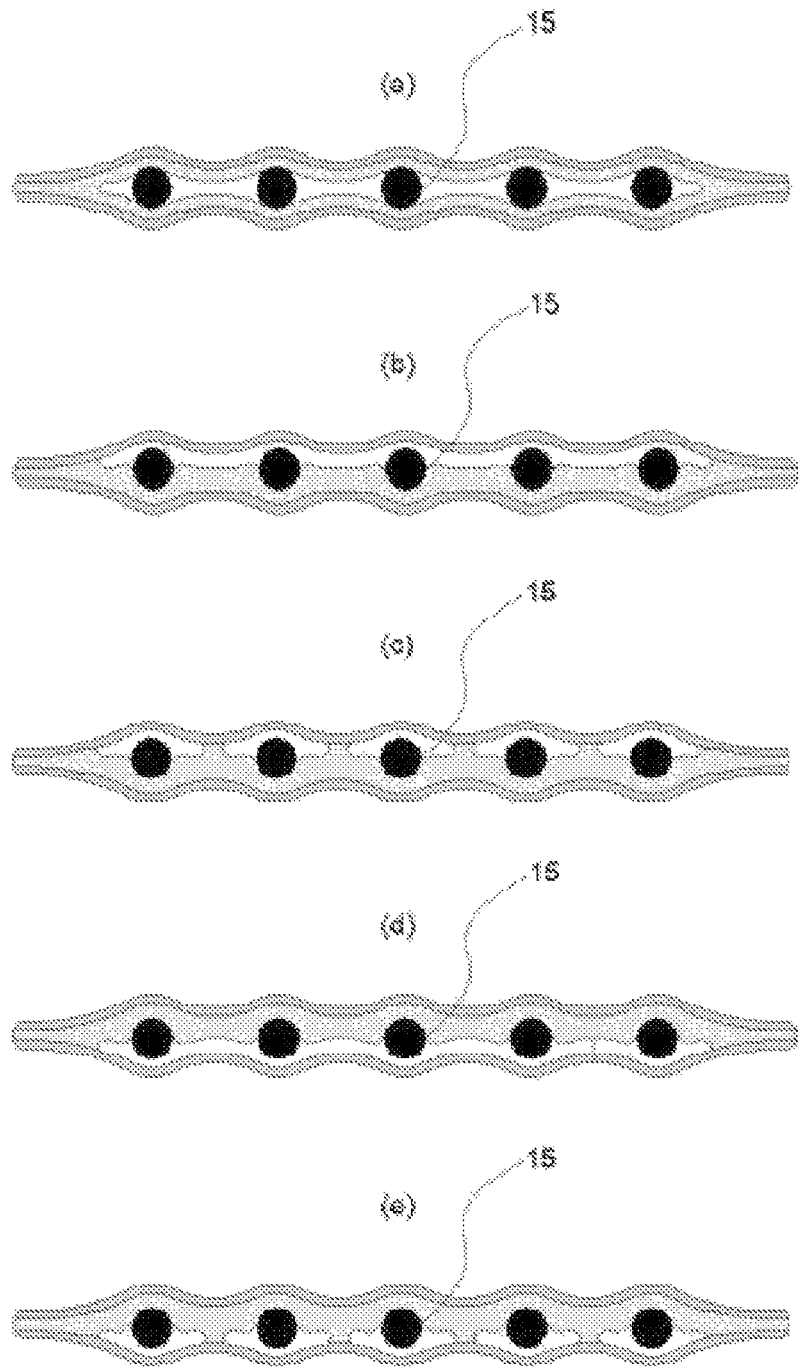

[FIG 9]
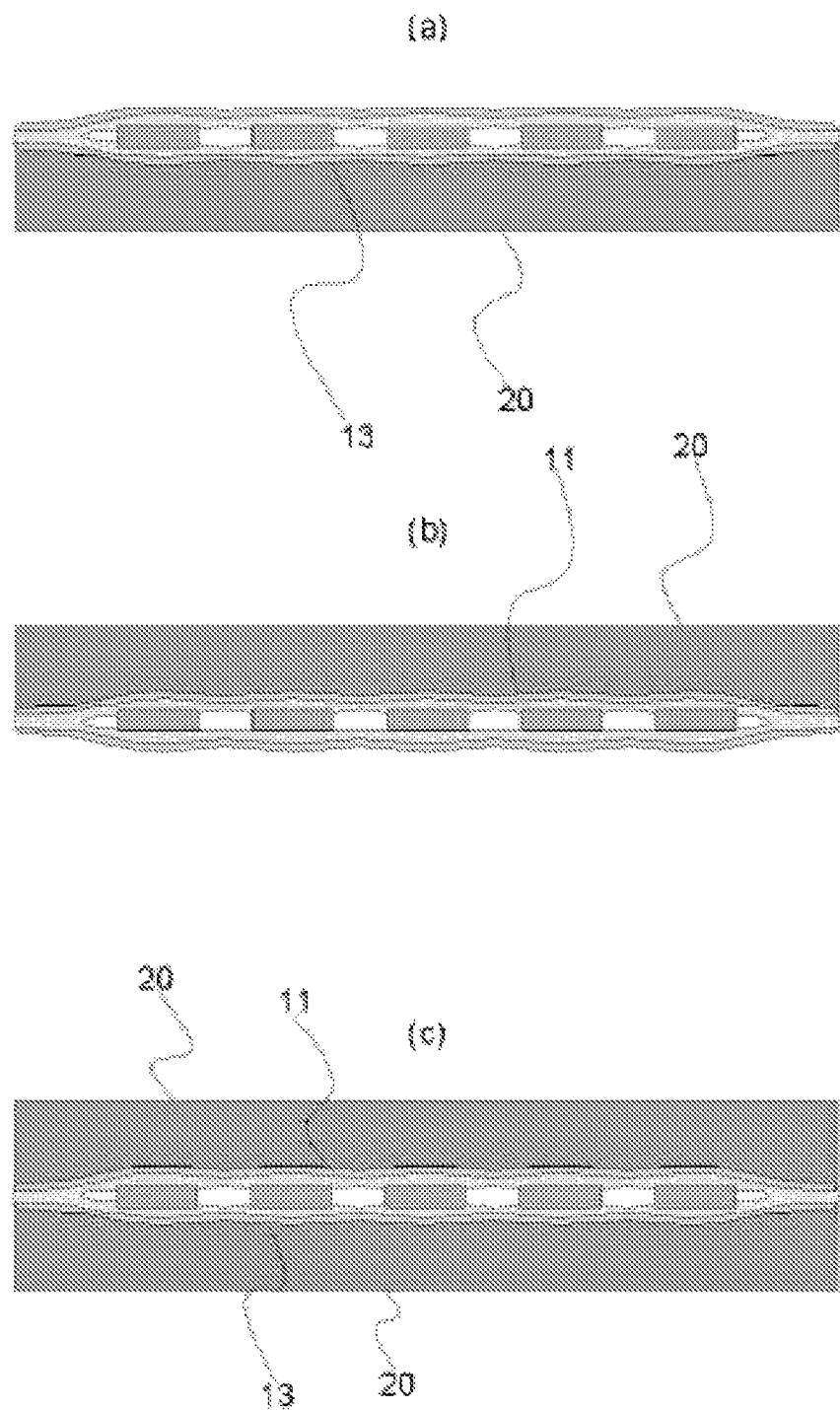

[FIG 10]
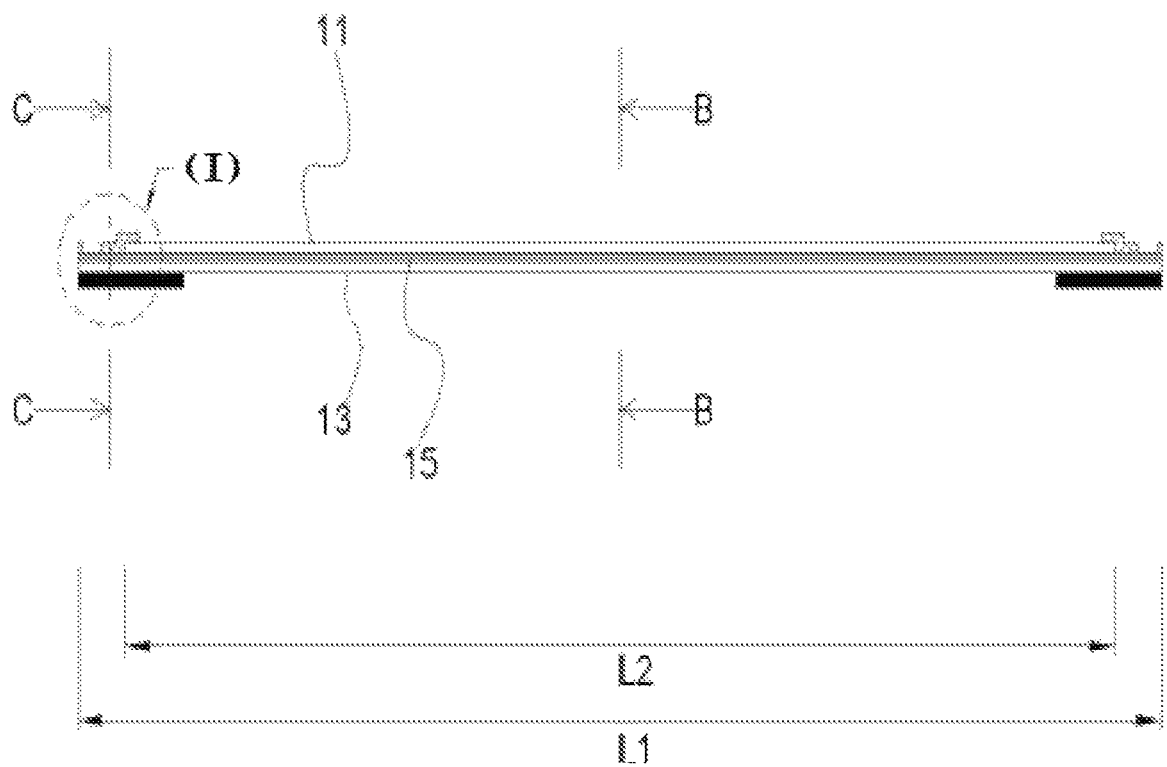

【FIG 11】
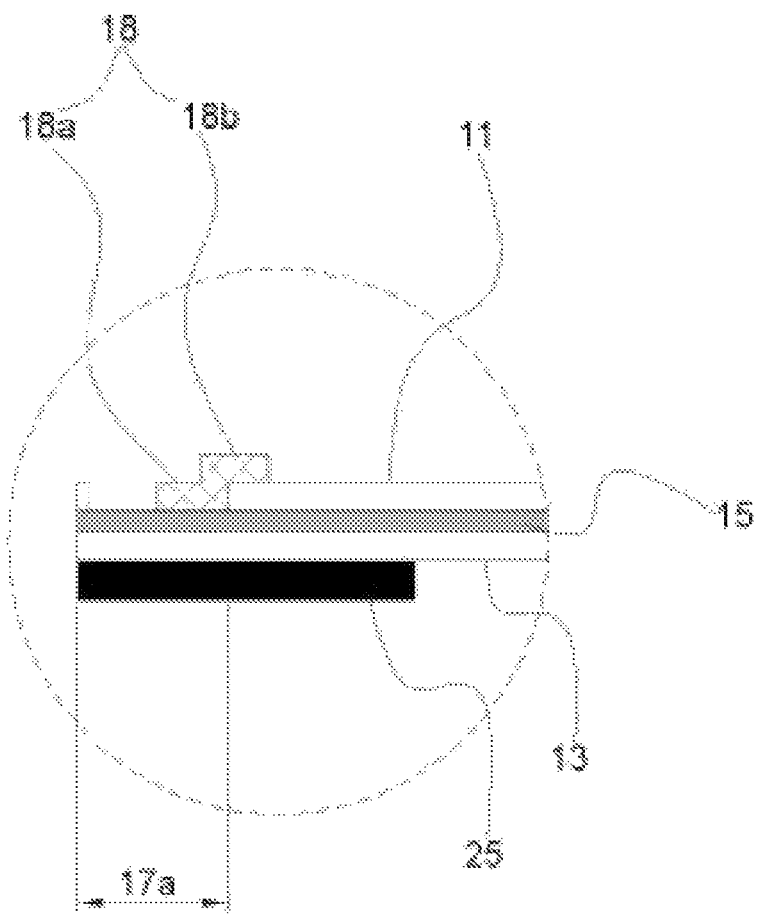

[FIG 12]
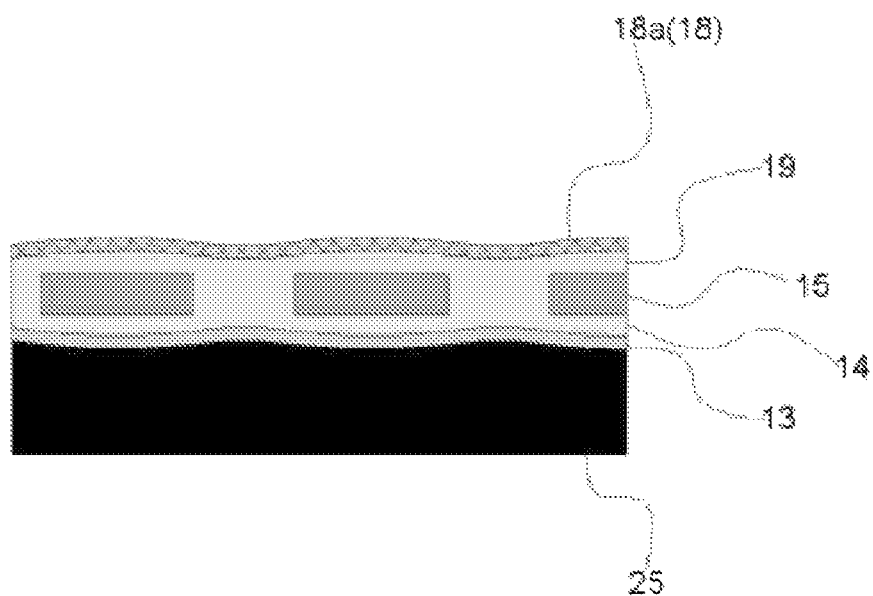
[FIG 13]
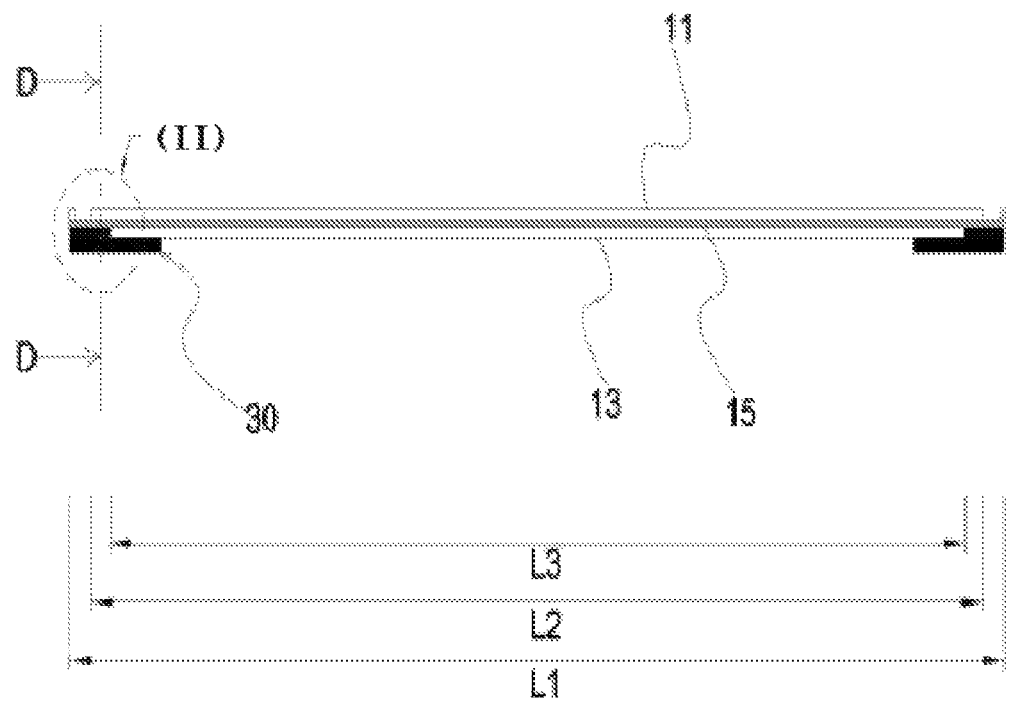

[FIG 14]
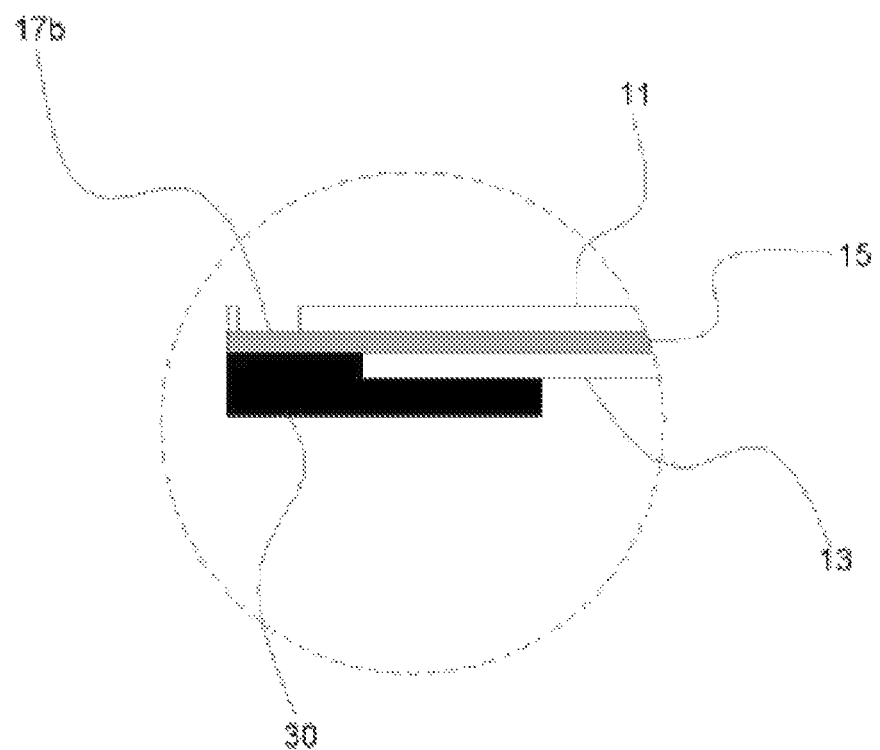

[FIG 15]
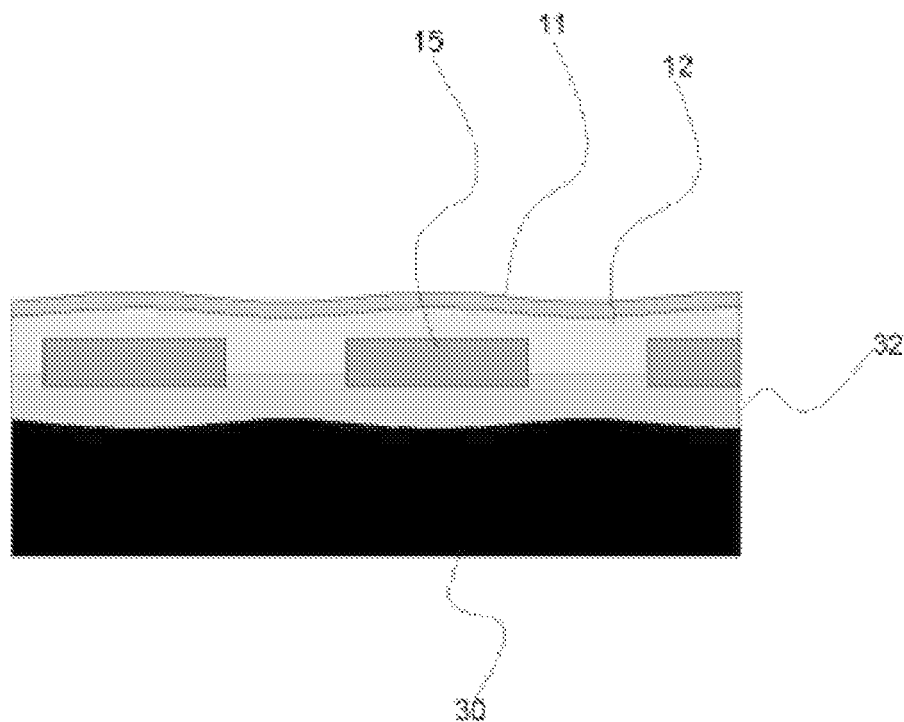

[FIG 16]
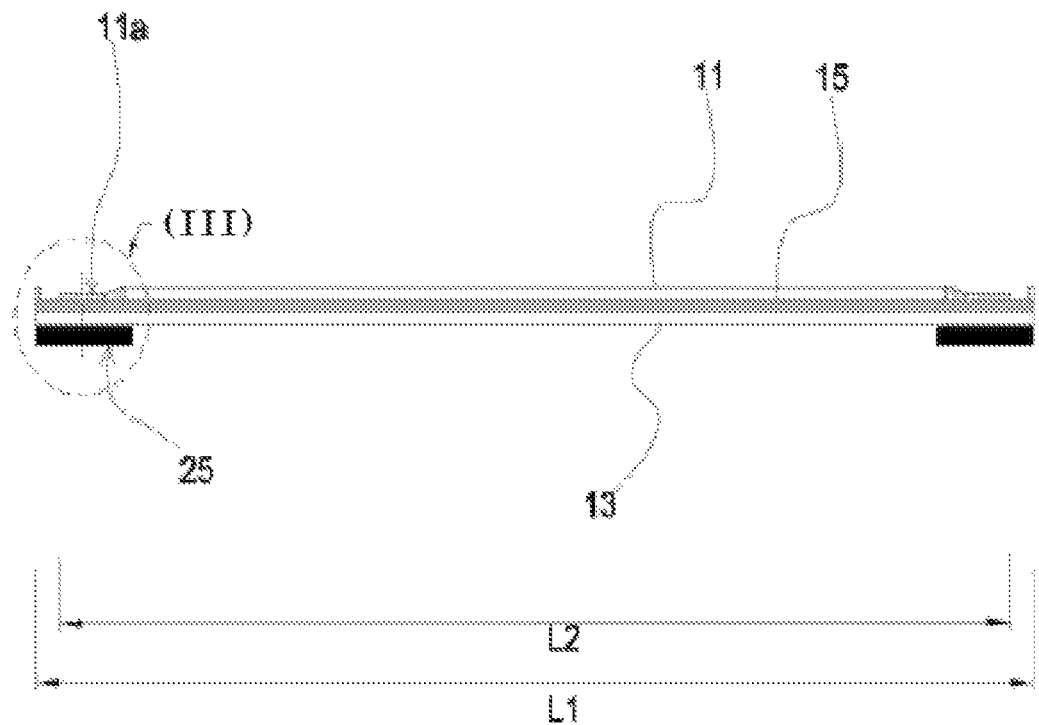
[FIG 17]
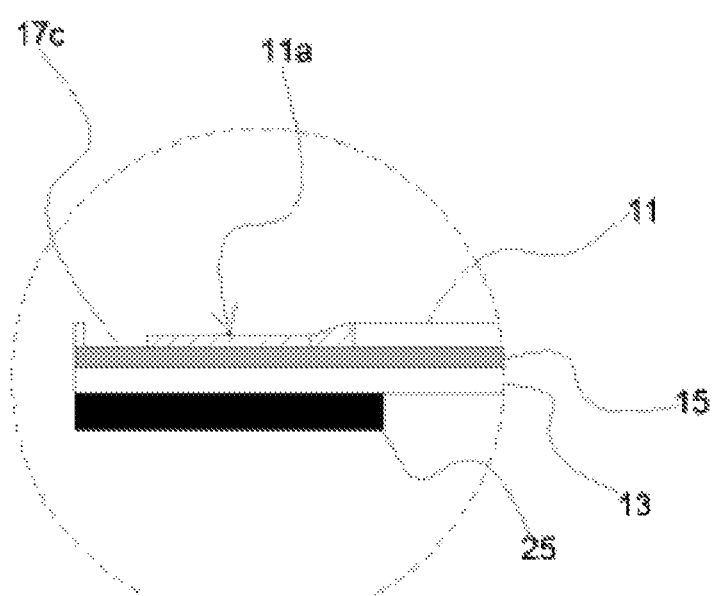

[FIG 18]
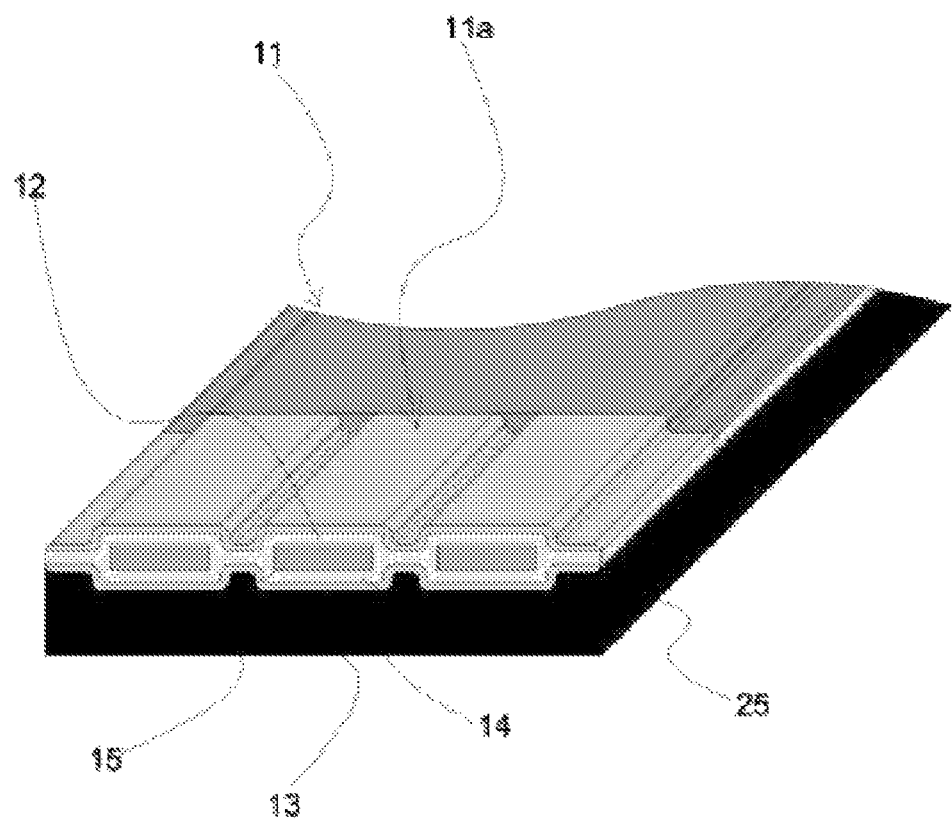

[FIG 19]
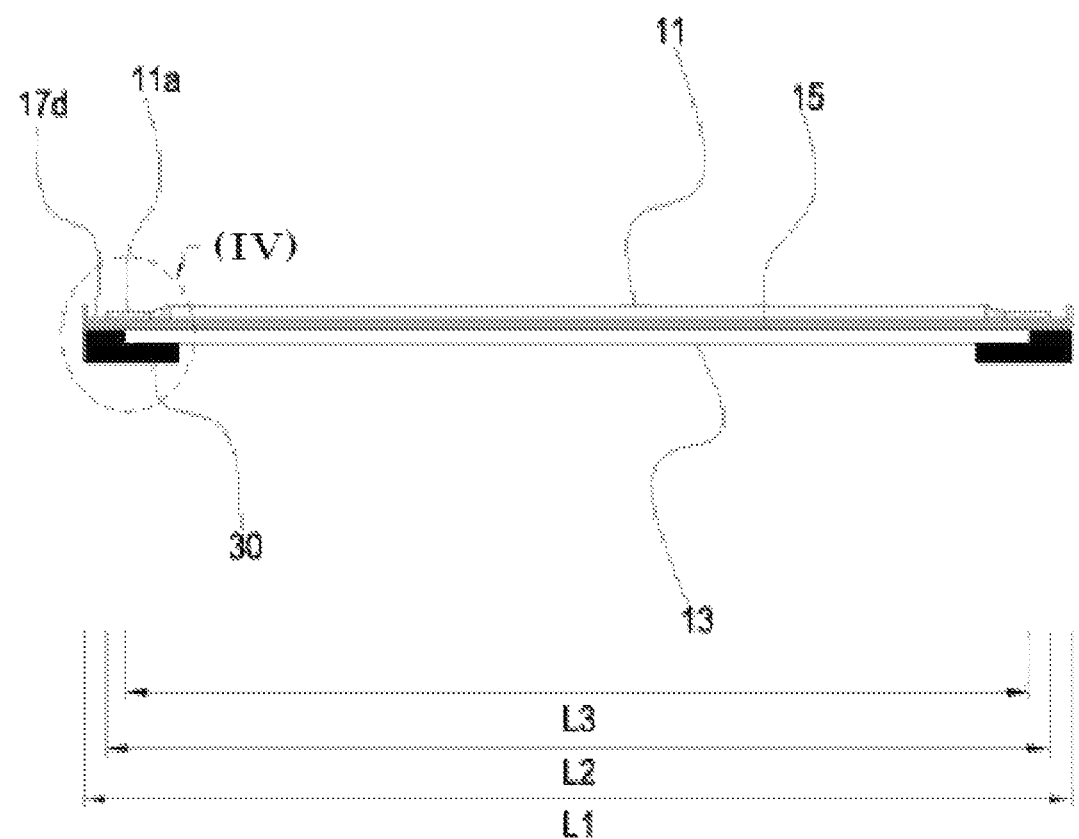

[FIG 20]
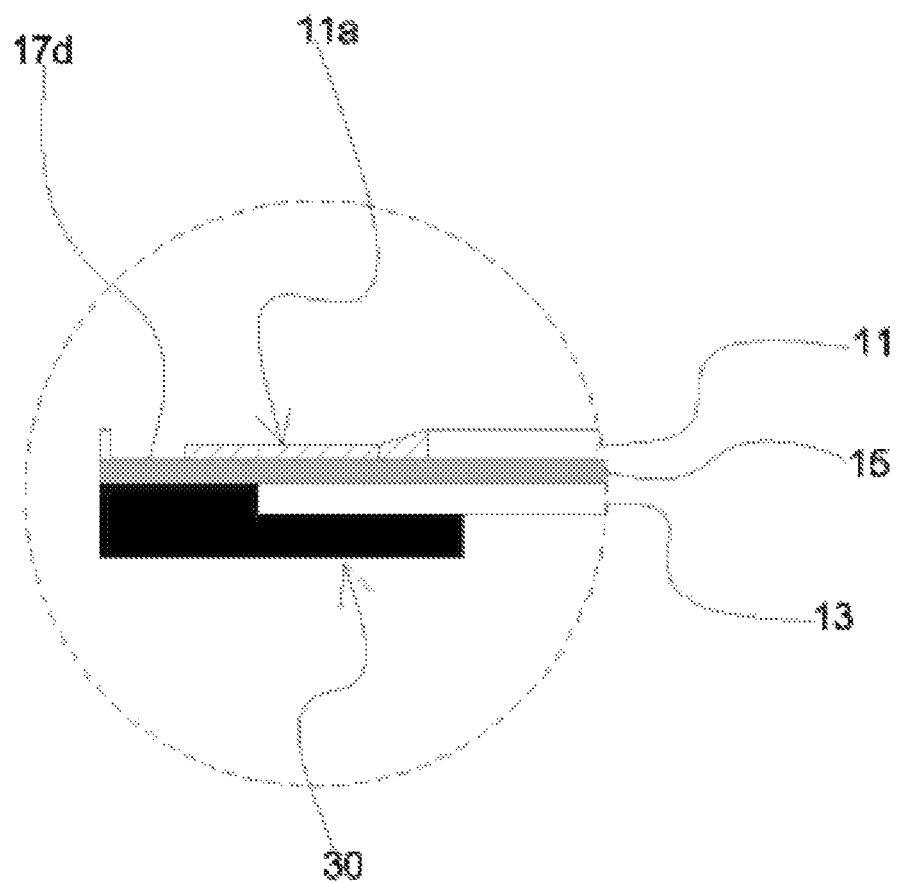

[FIG 21]
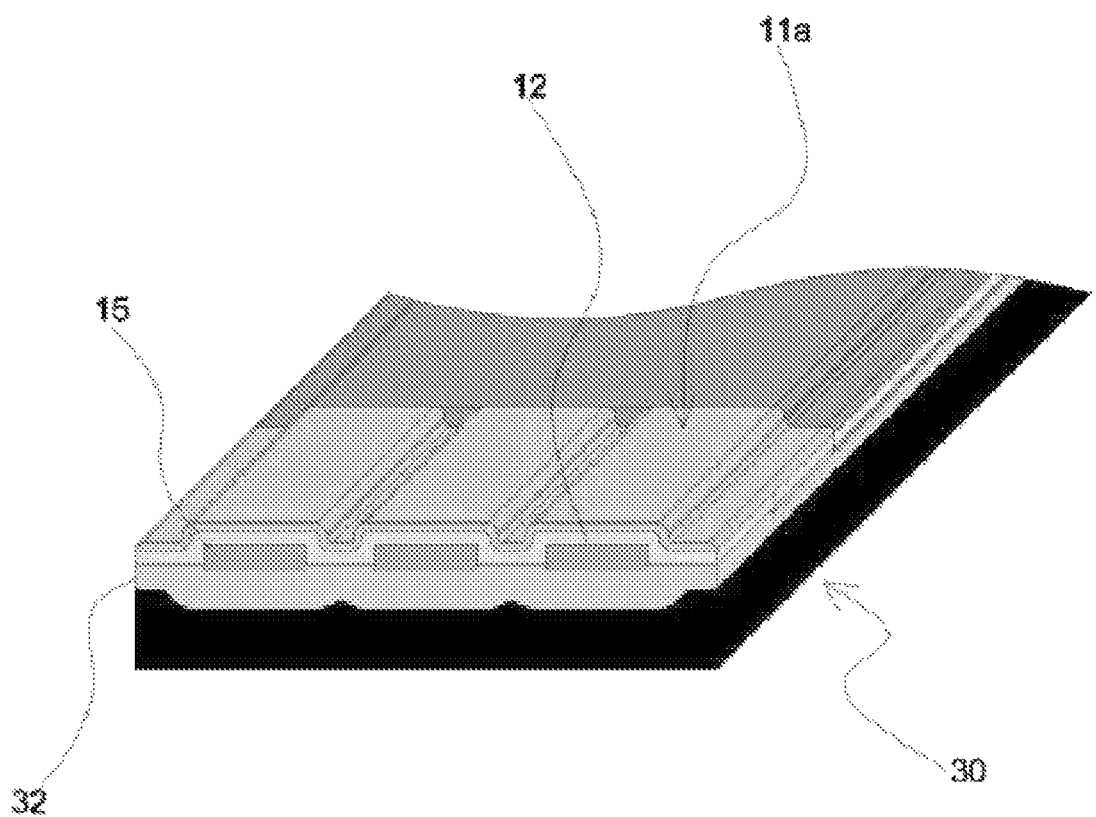

[FIG 22]
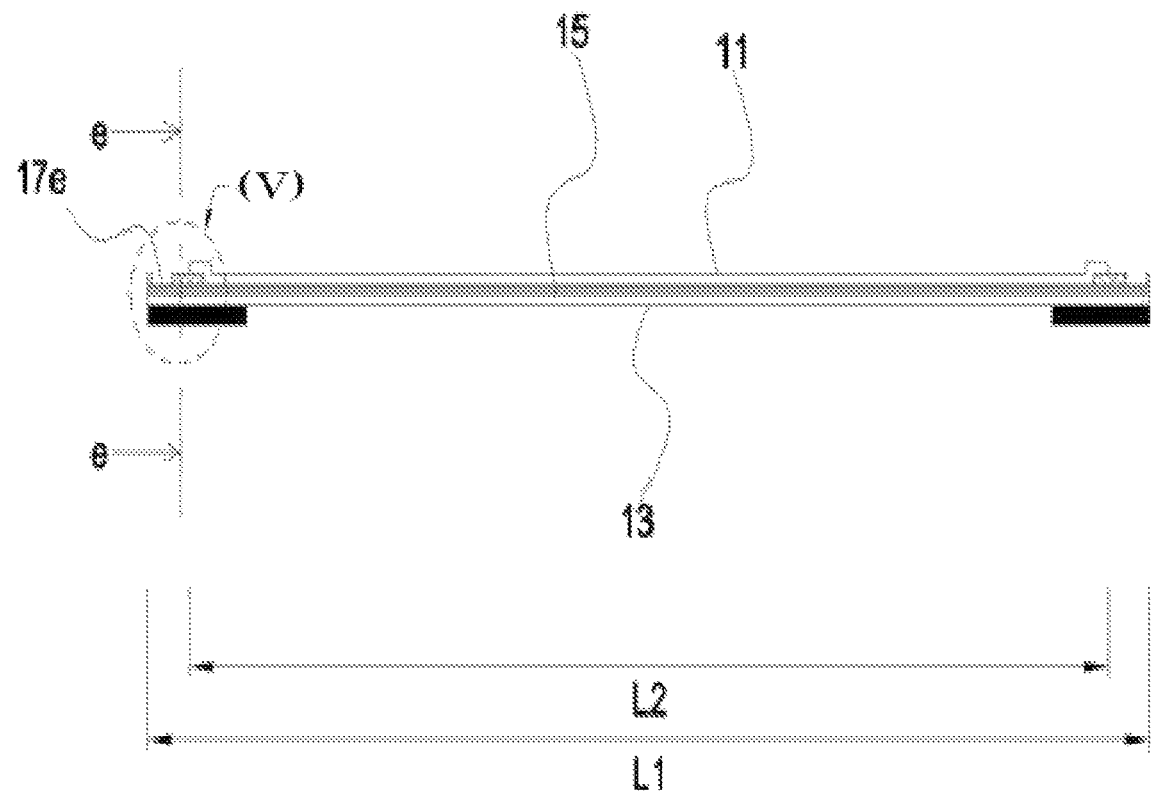

[FIG 23]
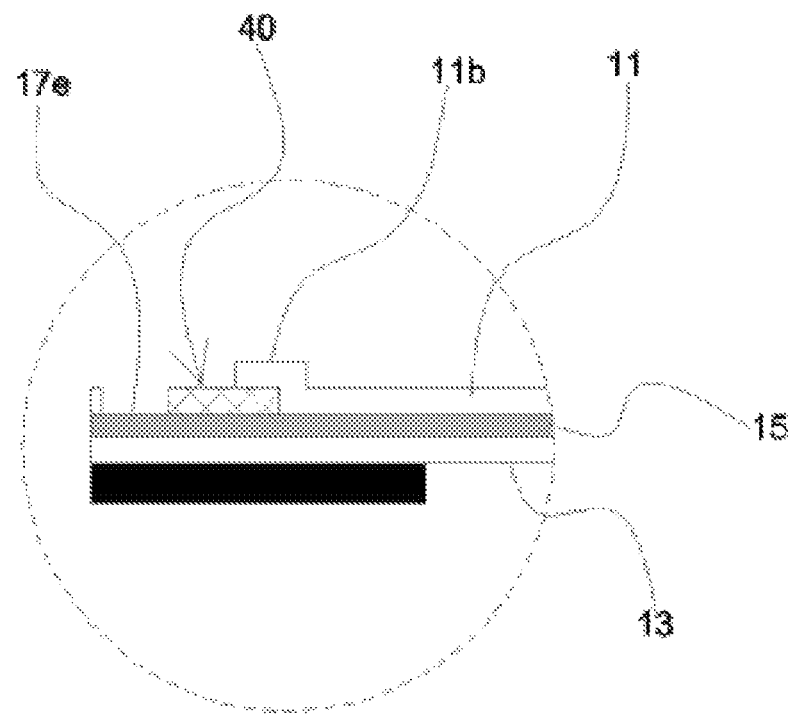
[FIG 24]
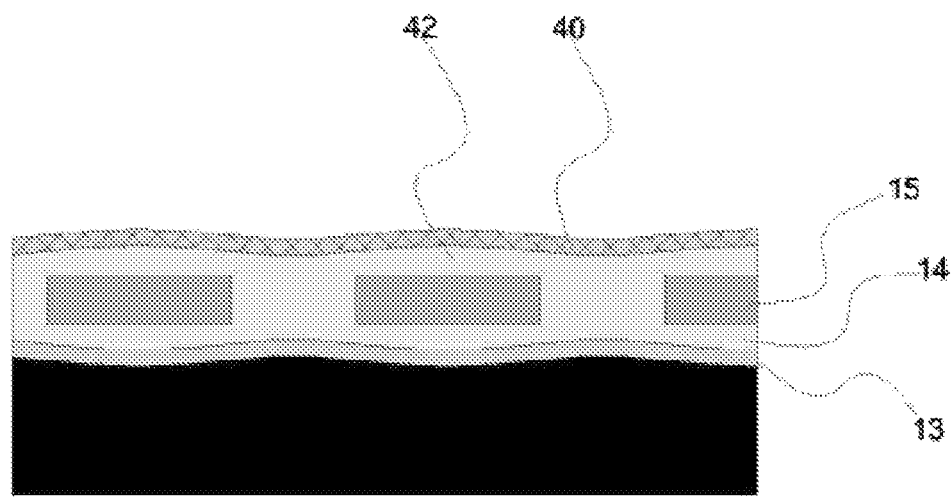

[FIG 25]
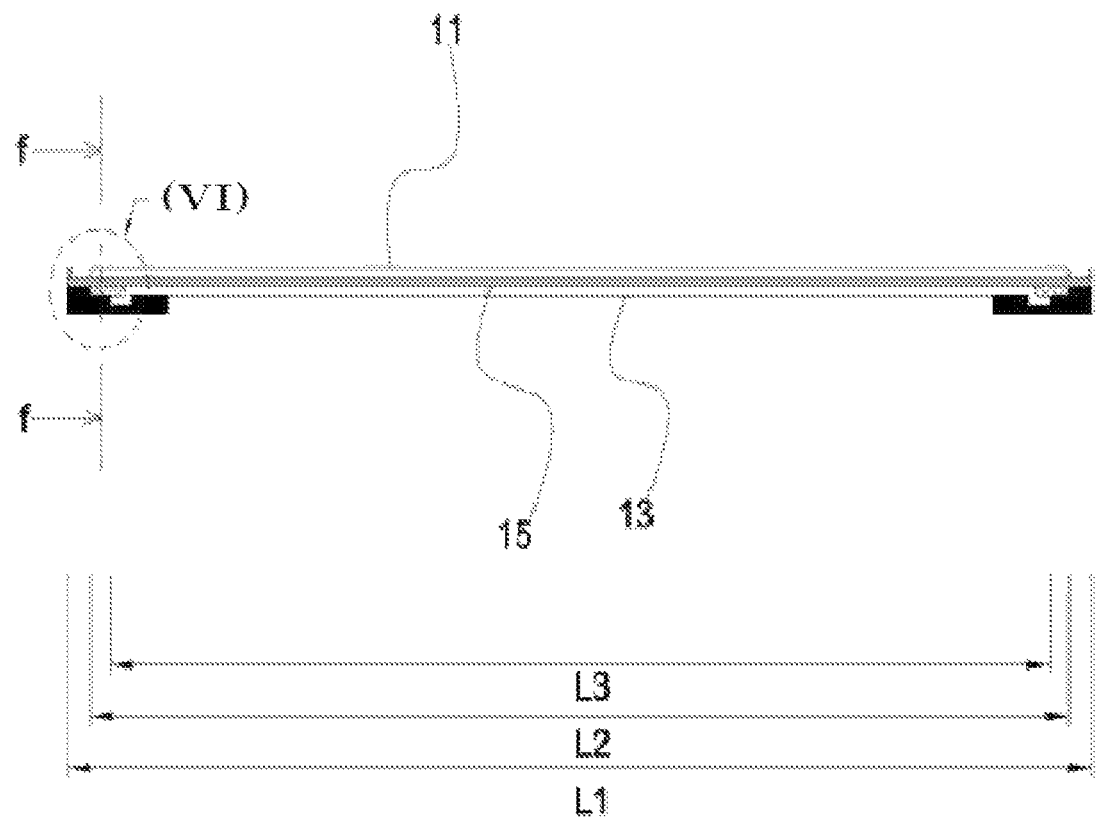

[FIG 26]
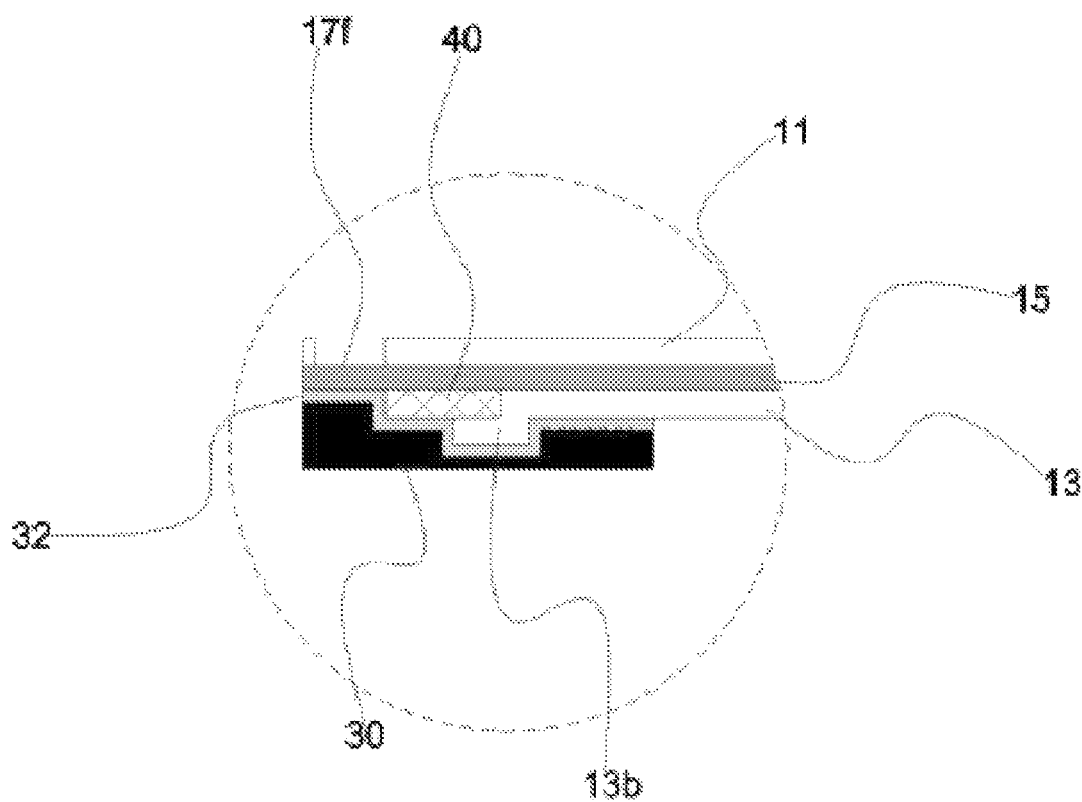

[FIG 27]
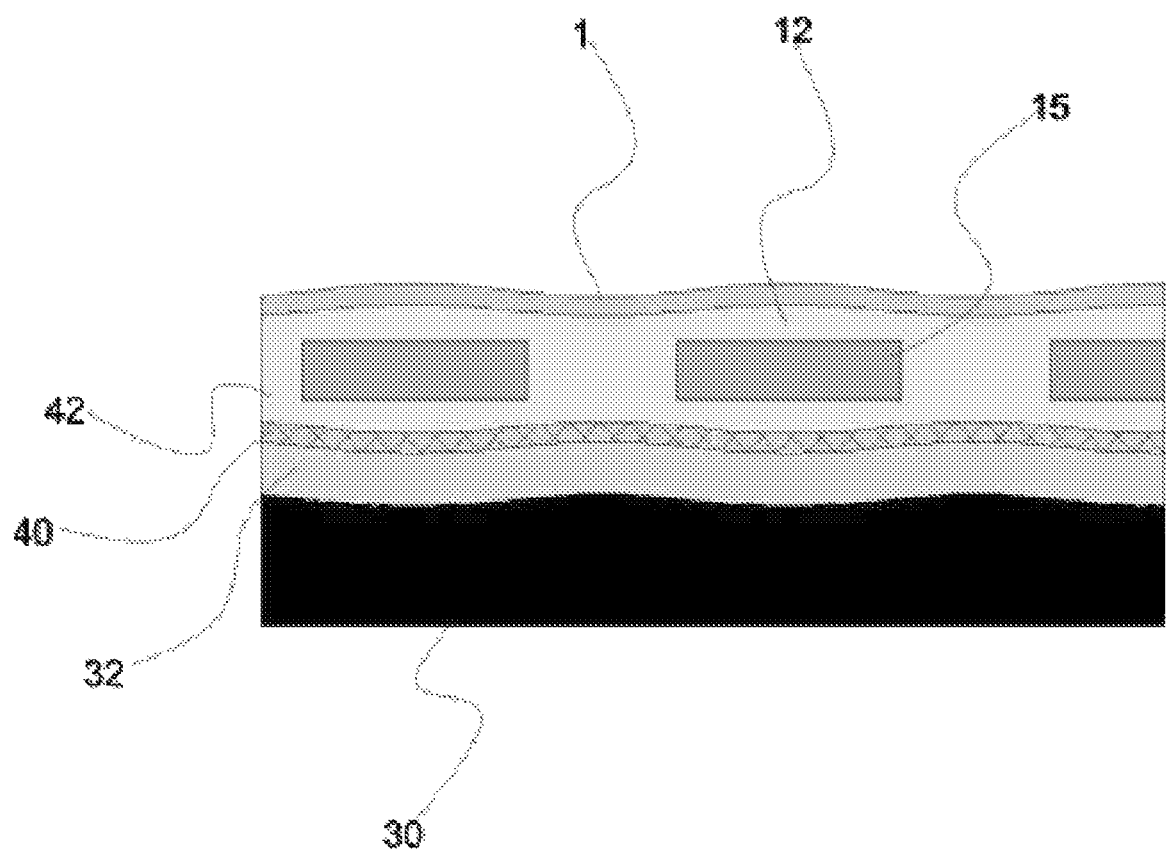

[FIG 28]
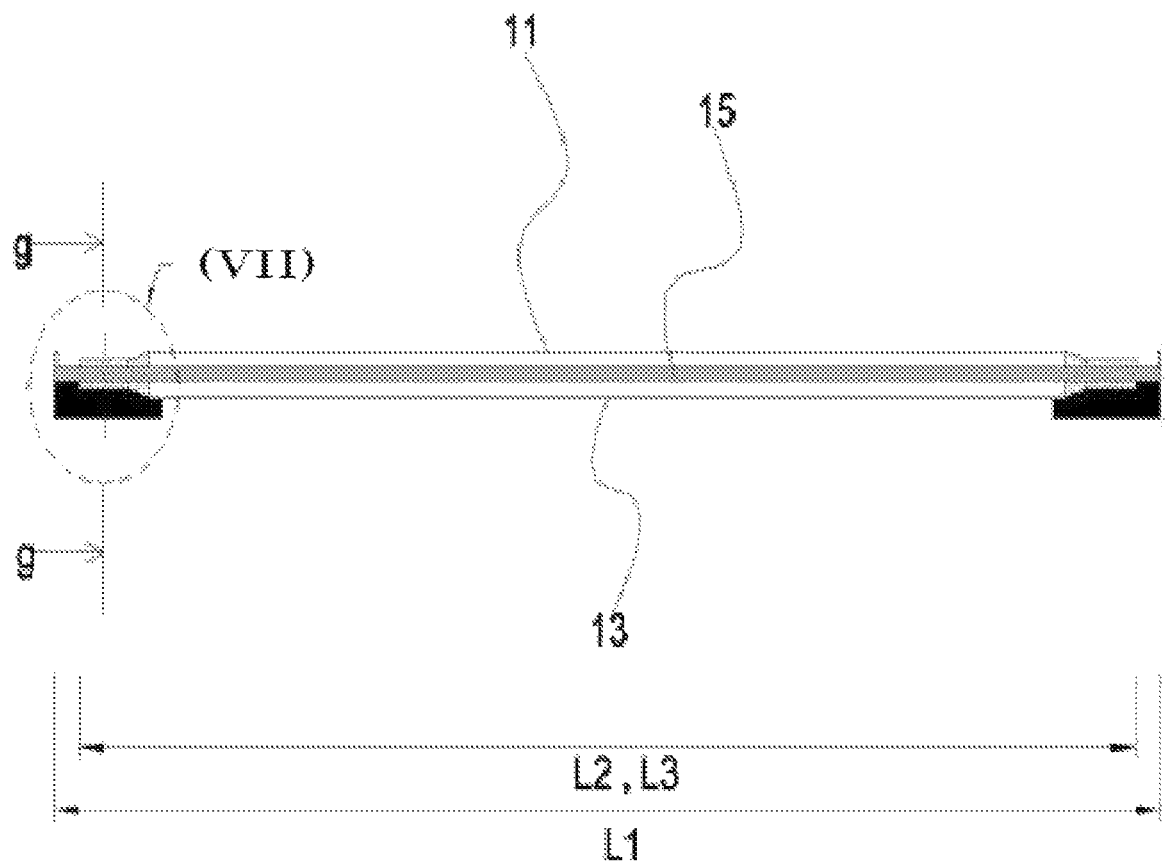

[FIG 29]
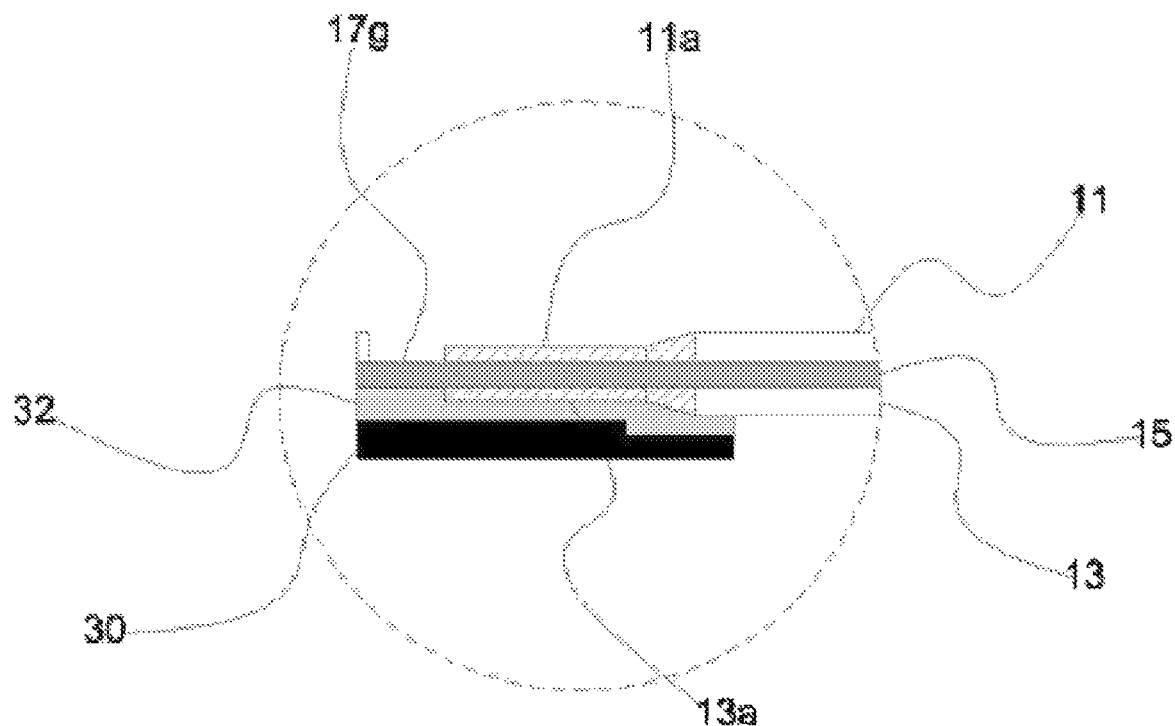

[FIG 30]
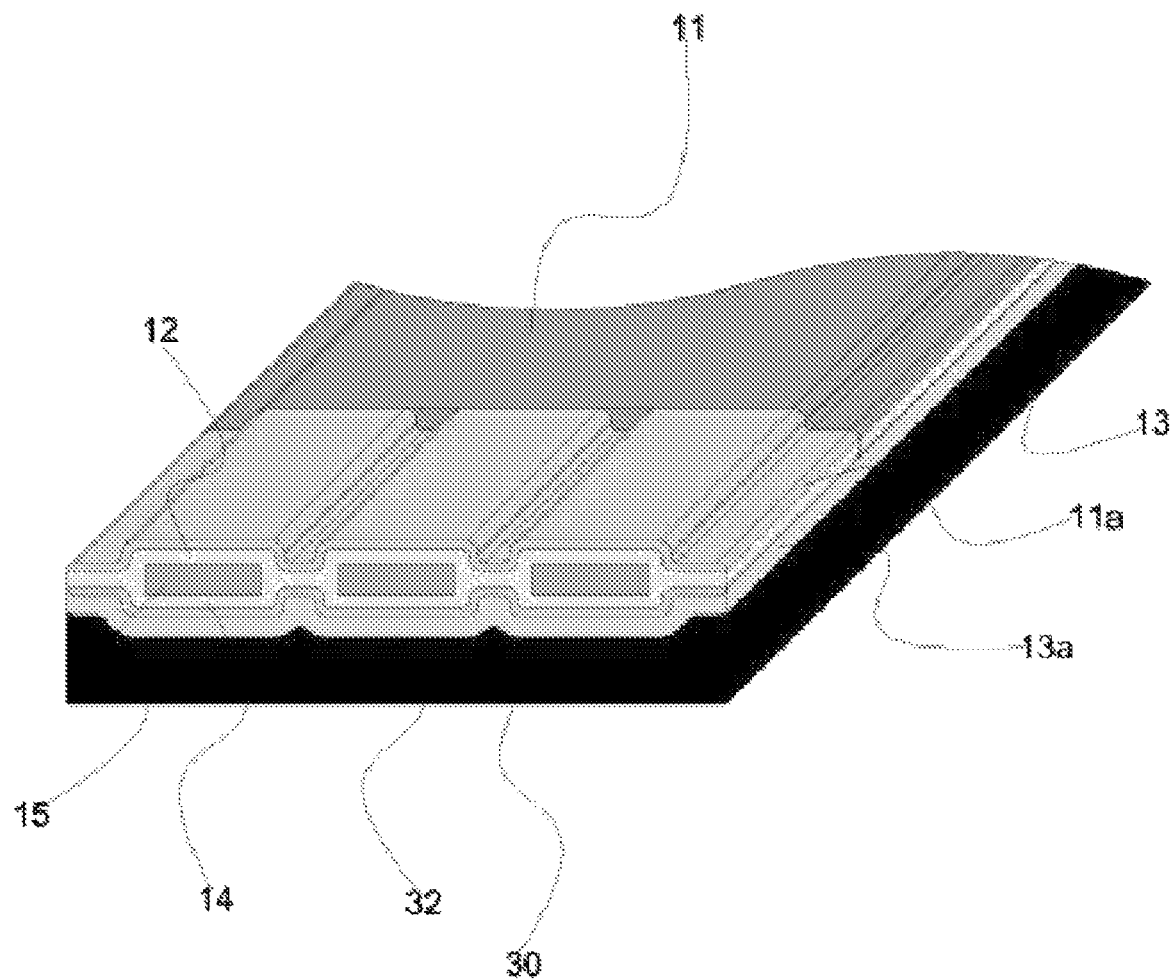

[FIG 31]
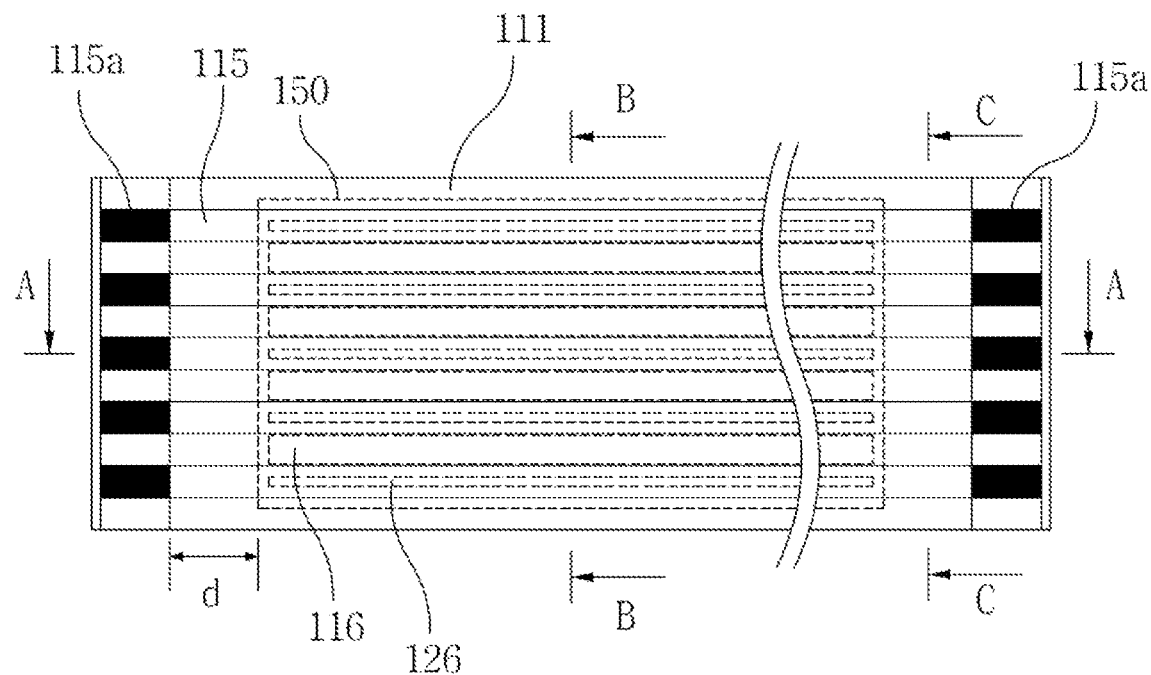
[FIG 32]
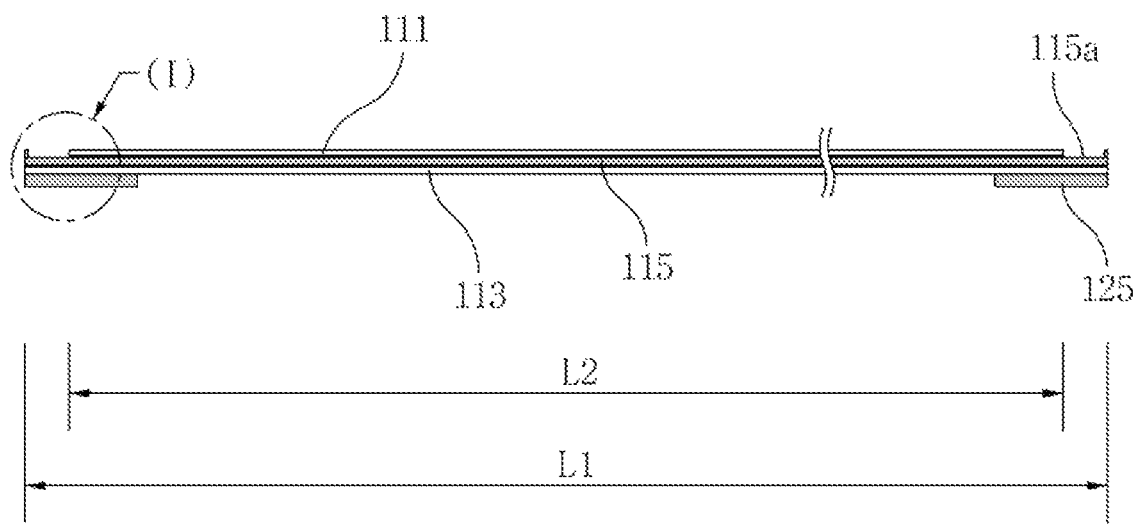

[FIG 33]
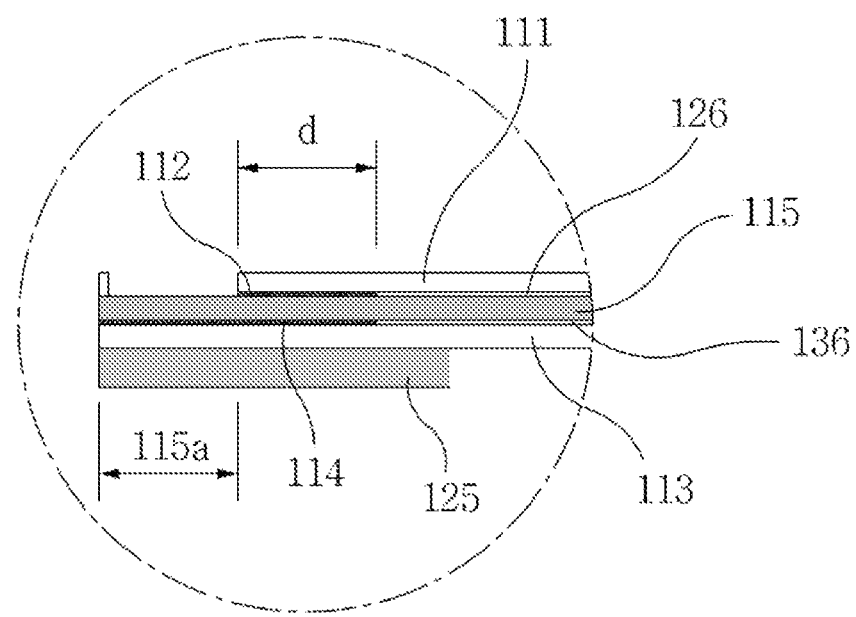
[FIG 34]
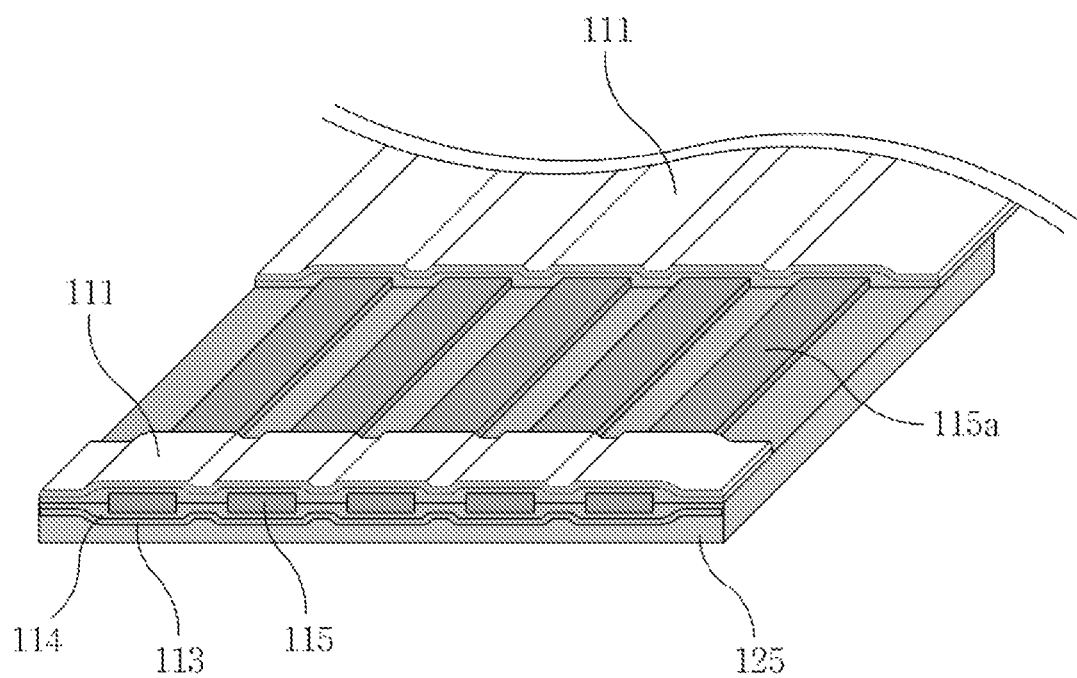

[FIG 35]
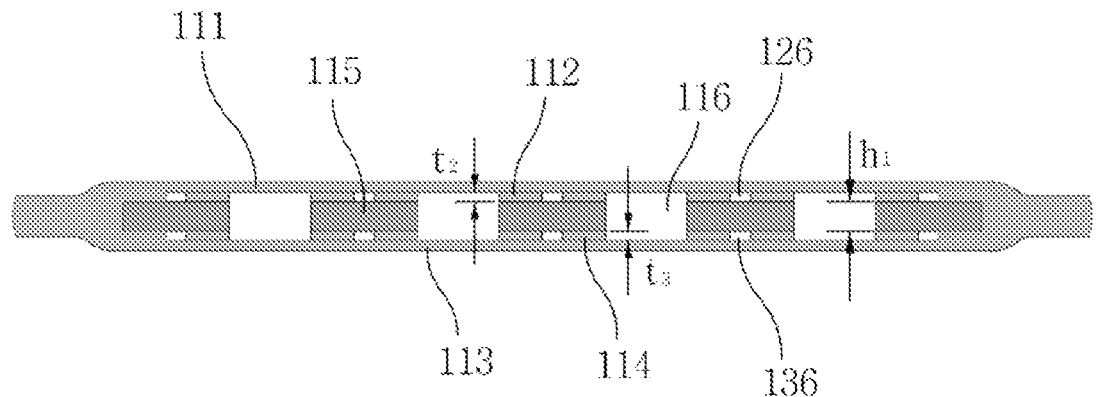
[FIG 36a]
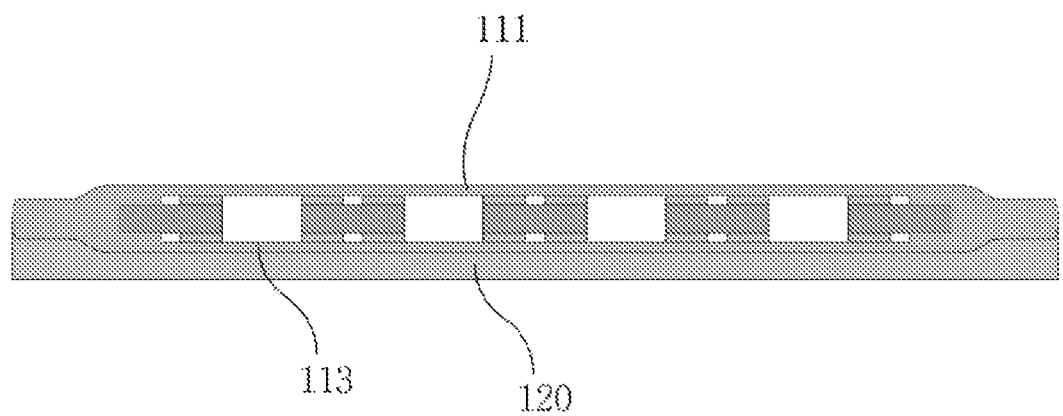
[FIG 36b]
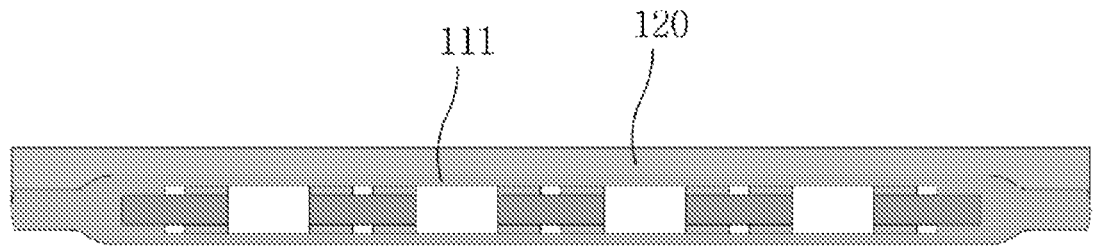

【FIG 36c】
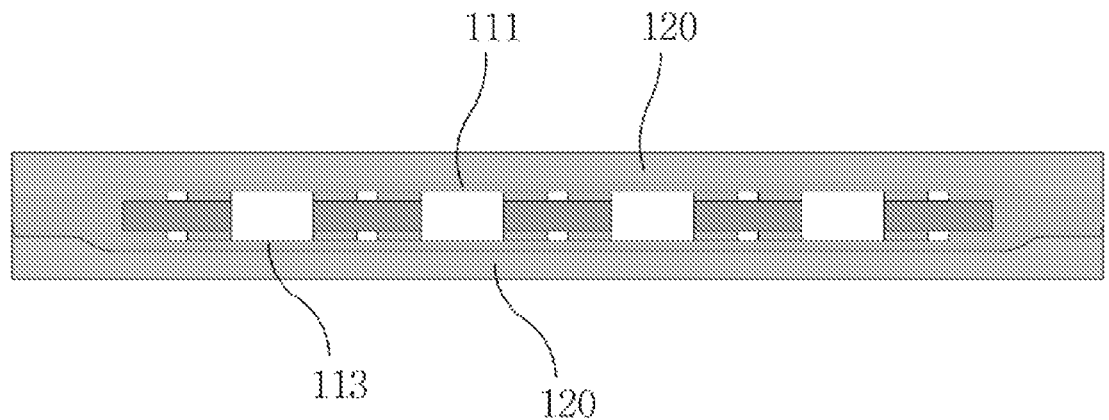
【FIG 37】
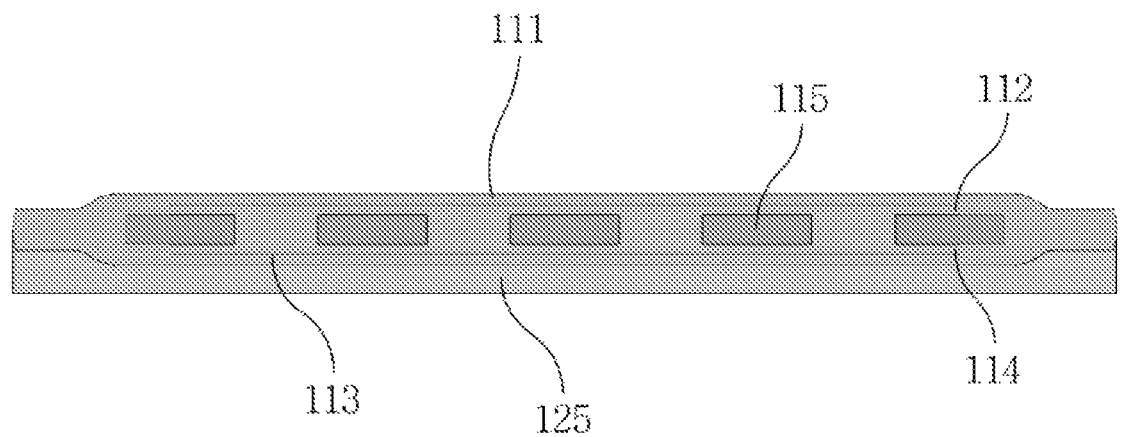

[FIG 38]
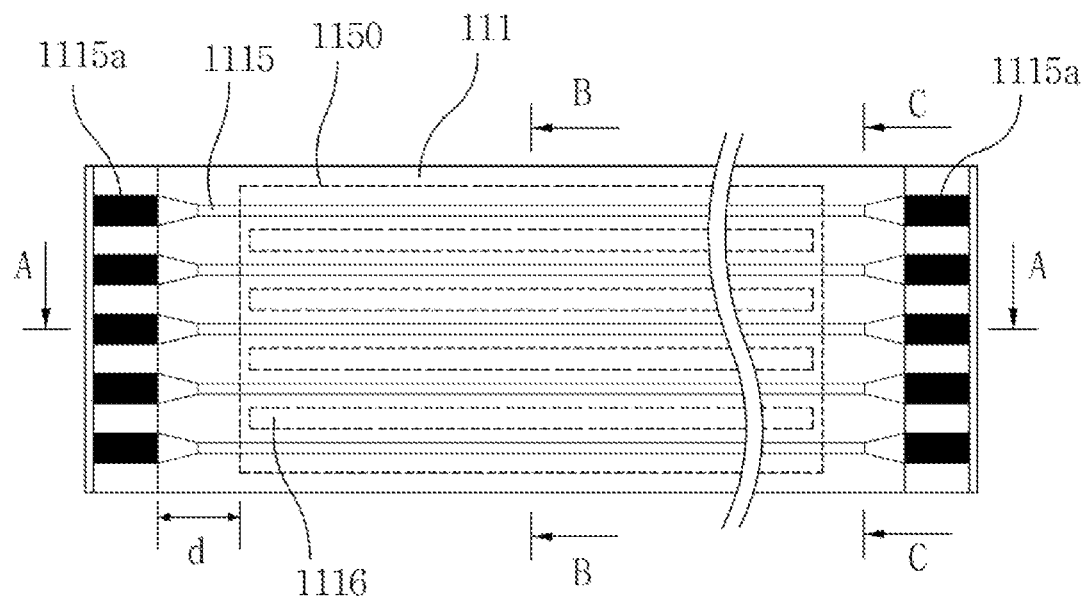
[FIG 39]
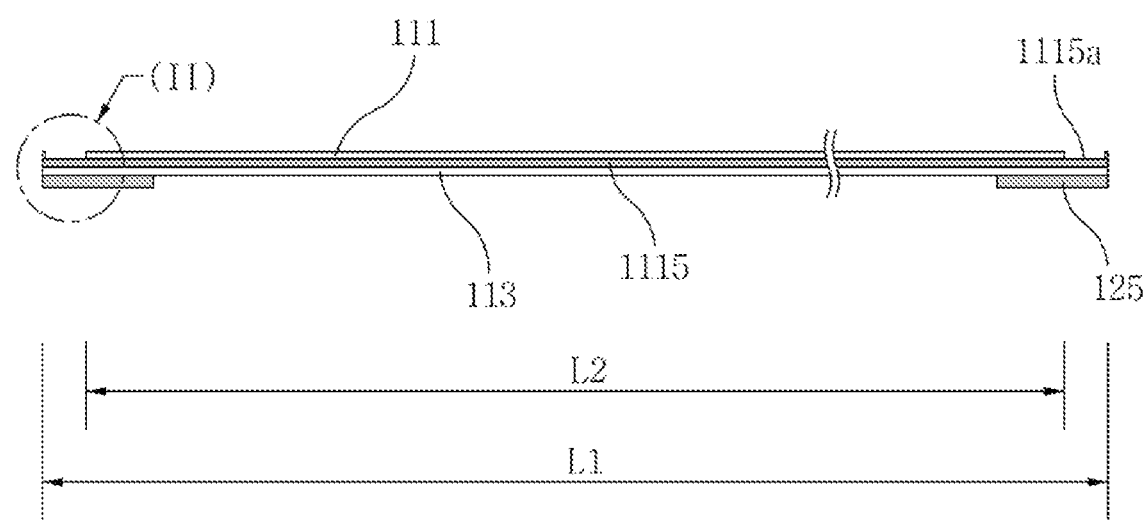

[FIG 40]
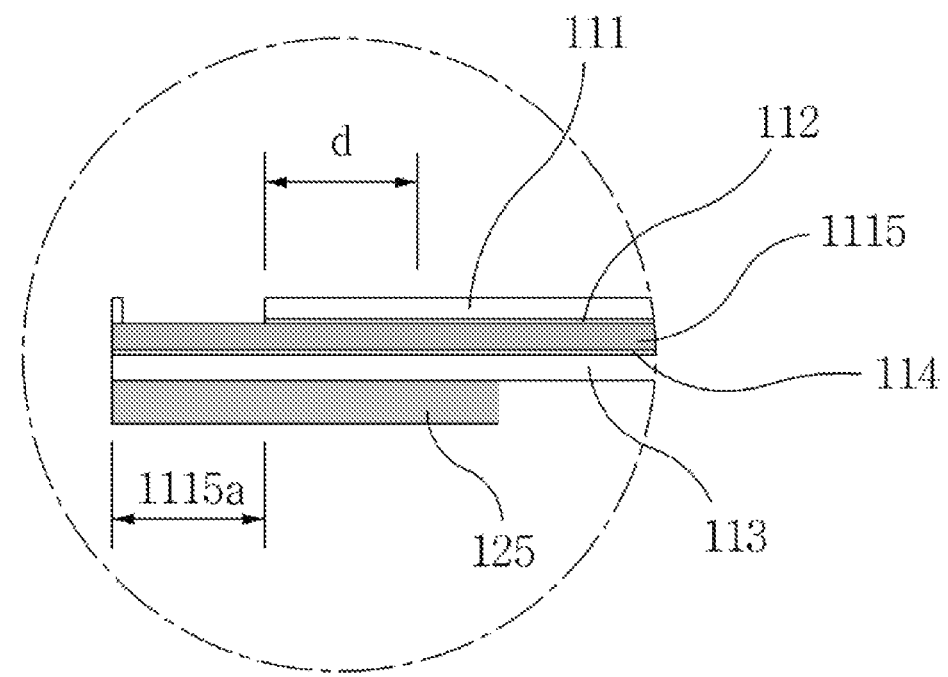
[FIG 41]
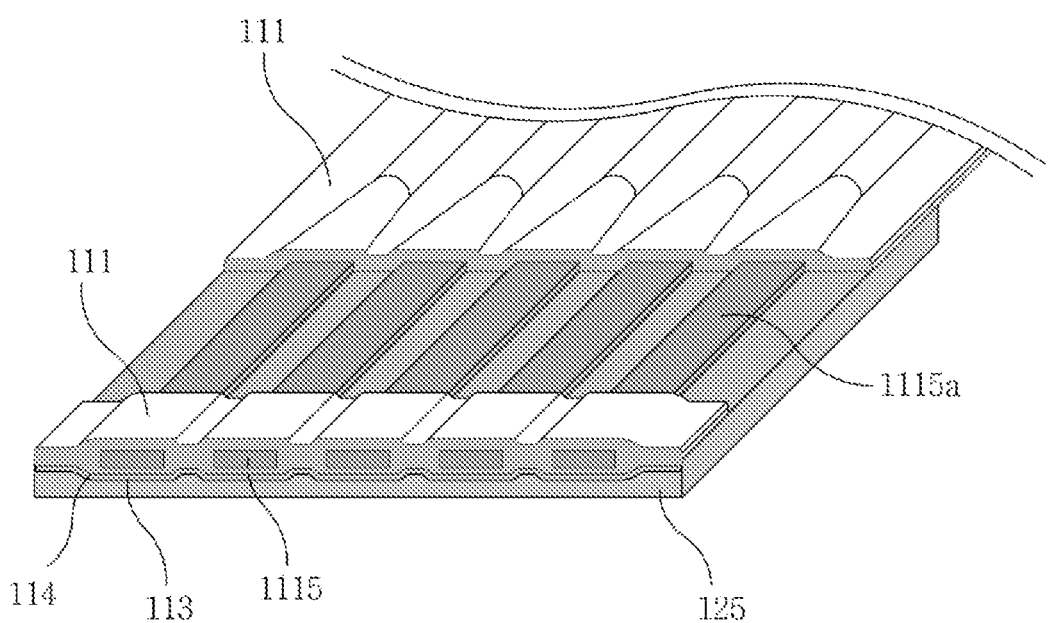

[FIG 42]
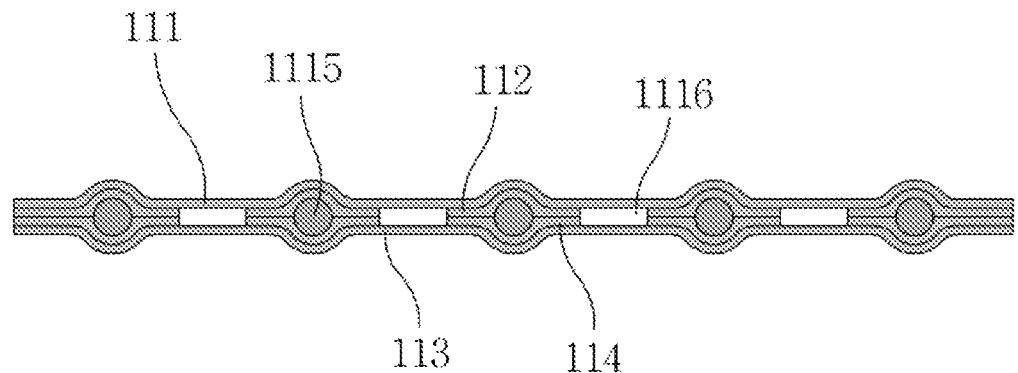
[FIG 43a]
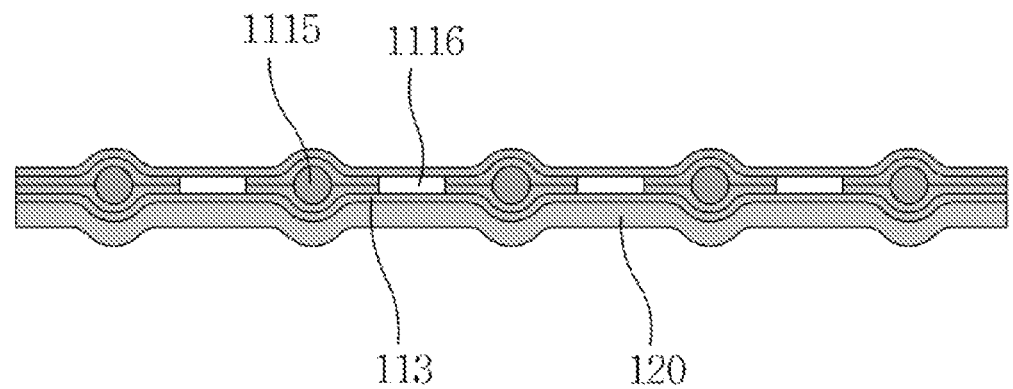
[FIG 43b]
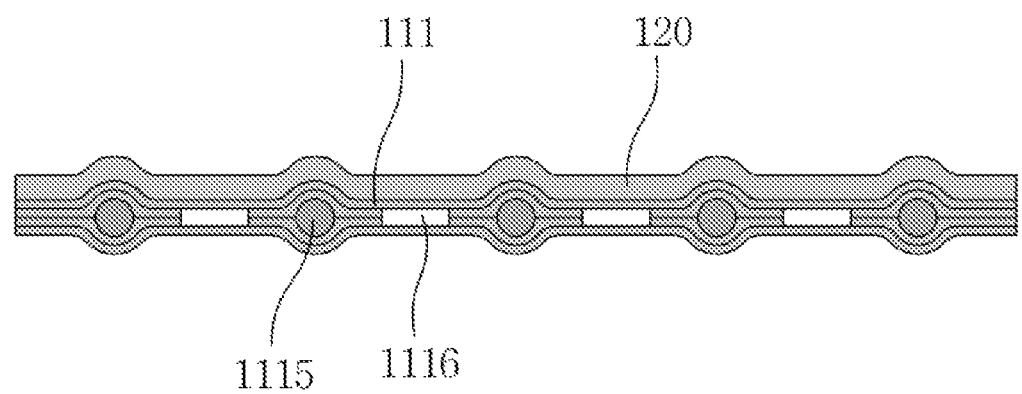

[FIG 43c]
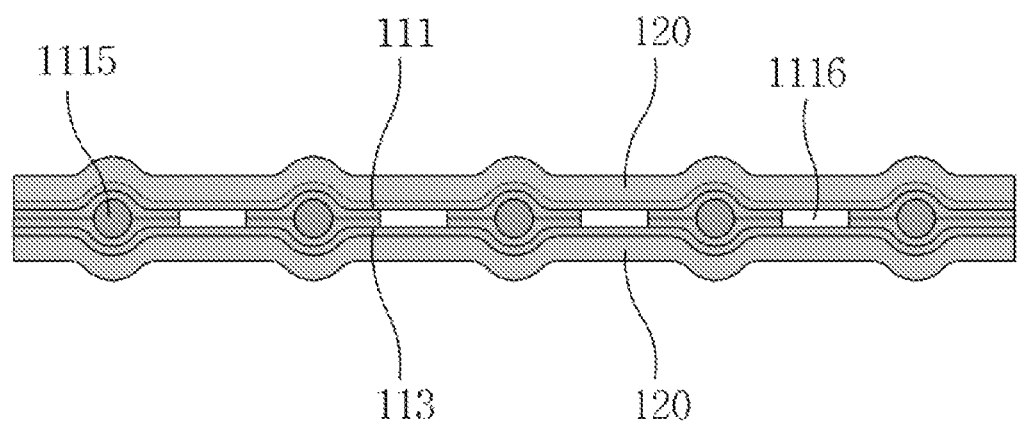
[FIG 44]
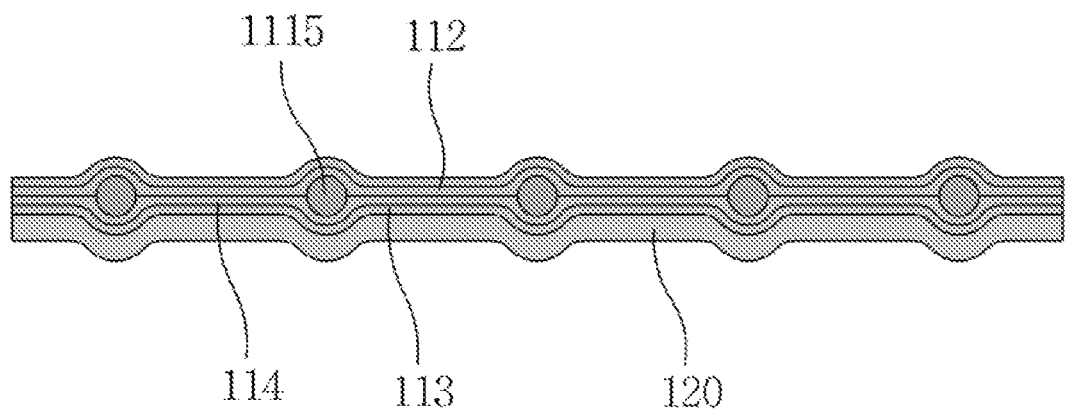

FLEXIBLE FLAT CABLE

CROSS-REFERENCE TO RELATED APPLICATIONS

This Application is a Divisional of co-pending U.S. patent application Ser. No. 15/969,339 filed on May 2, 2018, which is a Divisional of U.S. patent application Ser. No. 15/436,105 filed on Feb. 17, 2017 (now U.S. Pat. No. 10,008,304 issued on Jun. 26, 2018), which claims the priority benefit under 35 U.S.C. § 119(a) to Korean Patent Application Nos. 10-2016-0117929 filed in the Republic of Korea on Sep. 13, 2016 and 10-2016-0094120 filed in the Republic of Korea on Jul. 25, 2016, all of which are hereby expressly incorporated by reference into the present application.

BACKGROUND OF THE INVENTION

Field of the Invention

The present invention relates to a flexible flat cable, and more particularly, to a flexible flat cable in which a plurality of conductive wires are disposed between an upper film and a lower film, and an air gap is formed between the conductive wires.

Discussion of the Related Art

"Flat cable covering and flat cable using same" is disclosed in Korean Patent No. 10-0841000 (registered on Jun. 18, 2008).

Referring to the flat cable covering and the flat cable using the same, the flat cable covering is prepared by sequentially laminating on one surface of a heat-resistant substrate film with an adhesivity-improving layer and a flame-retardant heat-adhesive resin layer including 20 wt % to 40 wt % of a heat-adhesive resin mainly including a linear saturated polyester-based resin and 80 wt % to 60 wt % of filler constituents mainly including a mixed flame retardant including at least a hydrated metallic compound, antimony oxide, and a nitrogen-based compound. In addition, the flat cable is manufactured by stacking the covering on both sides of a plurality of conductors arranged in parallel in such a manner that the flame-retardant heat-adhesive resin layers make contact with the both sides of conductors, and heating and pressurizing the covering for integration.

However, since the flat cable covering and the flat cable using the same completely surround a periphery of the conductors by the flame-retardant heat-adhesive resin layers, there is a disadvantage that great transmission data loss (decrease in a transmission data rate) is caused due to a dielectric constant of the flame-retardant heat-adhesive resin layers.

SUMMARY OF THE INVENTION

Accordingly, an object of the present invention is to provide a flexible flat cable capable of minimizing loss of data transmitted through conductive wires, that is, the transmission data loss (decrease in the transmission data rate), by arranging a plurality of conductive wires between an upper film and a lower film, and forming an air gap between the conductive wires.

Another object of the present invention is to provide a flexible flat cable capable of preventing a plating solution from entering an air gap formed between the conductive wires when plating an exposed connection end of the conductive wires, by sealing the air gap formed at end portions of the upper film and the lower film.

To achieve the objects described above, according to one example of the present invention, there is provided a flexible flat cable including a plurality of conductive wires disposed between an upper film and a lower film, wherein the conductive wires are fixed by a first thermal bonding resin of the upper film and a second thermal bonding resin of the lower film, an air gap is formed between the conductive wires, and a side end of the upper film and a side end of the lower film are bonded by the first thermal bonding resin and the second thermal bonding resin.

The conductive wires may have a height larger than a sum of a thickness of the first thermal bonding resin and a thickness of the second thermal bonding resin, so that the air gap may be formed between the conductive wires.

According to another example of the present invention, there is provided a flexible flat cable including a plurality of conductive wires disposed between an upper film and a lower film, wherein the conductive wires are fixed by a first thermal bonding resin applied to a lower surface of the upper film, an air gap is formed between the conductive wires and between the lower film and the conductive wire, and a side end of the upper film and a side end of the lower film are bonded by the first thermal bonding resin.

The air gap may be divided into a plurality of air gaps by a plurality of partition portions formed at the first thermal bonding resin and arranged between the conductive wires.

According to still another example of the present invention, there is provided a flexible flat cable including a plurality of conductive wires disposed between an upper film and a lower film, wherein the conductive wires are fixed by a second thermal bonding resin applied to the lower film, an air gap is formed between the conductive wires and between the upper film and the conductive wire, and a side end of the upper film and a side end of the lower film are bonded by the second thermal bonding resin.

The air gap may be divided into a plurality of air gaps by a plurality of partition portions formed at the second thermal bonding resin and arranged between the conductive wires.

The first thermal bonding resin and the second thermal bonding resin may be hot-melt films.

The air gap may be formed between signal transmission lines for transmitting signals, and a thermal bonding resin is filled between the signal transmission line and a ground line and between ground lines.

The conductive wires may have a rectangular or circular sectional shape.

In the examples described above, an impedance matching sheet may be attached to a lower surface of the lower film, an upper portion of the upper film, or both the upper portion of the upper film and the lower surface of the lower film.

In the examples described above, according to an example for preventing a plating solution from entering the air gap in a plating process, a length of the conductive wires may be equal to a length of the lower film, so that an end portion of the conductive wires matches with an end portion of the lower film, the length of the conductive wires may be longer than a length of the upper film, so that an exposed connection end of the conductive wires is exposed outward from an end portion of the upper film, a lower horizontal portion of a cover film may be bonded to the exposed connection end of the conductive wires at the end portion of the upper film, and an upper horizontal portion of the cover film may be bonded to the upper film, so that the air gap is filled with an adhesive thickly applied to the cover film so as to prevent a plating solution from entering the air gap in a plating process, and the adhesive of the cover film and the second thermal bonding resin of the lower film may be bonded to surround the conductive wires.

In the examples described above, according to another example for preventing the plating solution from entering the air gap in the plating process, a length of conductive wires may be longer than a length of the upper film and a length of the lower film, so that an exposed connection end of the conductive wires is exposed outward from an end portion of the upper film and an end portion of the lower film, the length of the upper film may be longer than the length of the lower film, so that a second reinforcing plate is simultaneously bonded to a lower surface of the exposed connection end and the end portion of the lower film, a part of the second reinforcing plate may overlap with the end portion of the upper film, the air gap may be filled with an adhesive thickly applied to the second reinforcing plate, and the adhesive and the first thermal bonding resin of the upper film may be bonded to surround a periphery of the conductive wires at the exposed connection end.

In the examples described above, according to still another example for preventing the plating solution from entering the air gap in the plating process, a length of the conductive wires may be equal to a length of the lower film, so that an end portion of the conductive wires matches with an end portion of the lower film, the length of the conductive wires may be longer than a length of the upper film, so that an exposed connection end of the conductive wires is exposed outward from an end portion of the upper film, a thermal-pressed end of the upper film may be formed by thermally pressing the end portion of the upper film, so that the air gap is pressed at the thermal-pressed end so as to prevent a plating solution from entering the air gap in a plating process, and the first thermal bonding resin applied to the thermal-pressed end of the upper film and the second thermal bonding resin of the lower film may be bonded to each other so as to surround a periphery of the conductive wires.

In the examples described above, according to still another example for preventing the plating solution from entering the air gap in the plating process, a length of the conductive wires may longer than a length of the upper film and a length of the lower film, so that an exposed connection end of the conductive wires is exposed outward from an end portion of the upper film and an end portion of the lower film, the length of the upper film may be longer than the length of the lower film, a second reinforcing plate may be bonded to a lower surface of the exposed connection end and the end portion of the lower film and a thermal-pressed end for pressing the air gap may be formed at the end portion of the upper film by thermally pressing the end portion of the upper film so as to prevent a plating solution from entering the air gap in a plating process, and the first thermal bonding resin applied to the thermal-pressed end of the upper film and an adhesive of the second reinforcing plate may be bonded to each other so as to surround a periphery of the conductive wires.

In the examples described above, according to still another example of a structure for preventing the plating solution from entering the air gap in the plating process, a length of the conductive wires may be equal to a length of the lower film, so that an end portion of the conductive wires is matched with an end portion of the lower film, the length of the conductive wires may be longer than a length of the upper film, so that an exposed connection end of the conductive wires is exposed outward from an end portion of the upper film, an air gap prevention film may be attached to an upper surface of the exposed connection end at the end portion of the upper film, a part of the air gap prevention film may be covered with a cover end portion of the upper film, and the air gap may be filled with an adhesive thickly applied to the air gap prevention film so as to prevent a plating solution from entering the air gap in a plating process, and the adhesive of the air gap prevention film and the second thermal bonding resin of the lower film may be bonded to surround the conductive wires.

In the examples described above, according to still another example of a structure for preventing the plating solution from entering the air gap in the plating process, a length of the conductive wires may be longer than a length of the upper film and a length of the lower film, so that an exposed connection end of the conductive wires is exposed outward from an end portion of the upper film and an end portion of the lower film, the length of the upper film may be longer than the length of the lower film, an air gap prevention film may be attached to a lower surface of the exposed connection end at the end portion of the lower film, a part of the air gap prevention film may be covered with a cover end portion of the lower film, and the air gap may be filled with an adhesive thickly applied to the air gap prevention film so as to prevent a plating solution from entering the air gap in a plating process, and the adhesive of the air gap prevention film and the first thermal bonding resin of the upper film may be bonded to surround the conductive wires.

In the examples described above, according to still another example of a structure for preventing the plating solution from entering the air gap in the plating process, a length of the conductive wires may be longer than a length of the upper film and a length of the lower film, so that an exposed connection end of the conductive wires is exposed outward from an end portion of the upper film and an end portion of the lower film, the length of the upper film may be equal to the length of the lower film, a thermal-pressed end for pressing the air gap may be formed at the end portion of the upper film and a thermal-pressed end for pressing the air gap may be formed at the end portion of the lower film by heat-pressing the end portion of the upper film and the end portion of the lower film so as to prevent a plating liquid from entering the air gap in a plating process, the first thermal bonding resin applied to the thermal-pressed end of the upper film and the second thermal bonding resin applied to the thermal-pressed end of the lower film may be bonded to surround the conductive wires, and the second reinforcing plate may be bonded to a lower surface of the exposed connection end and the heat-pressed end of the lower film by an adhesive.

According to another embodiment of the present invention to achieve the objects of the present invention, there is provided a flexible flat cable including a plurality of conductive wires disposed between an upper film and a lower film, wherein the conductive wires are fixed by a first thermal bonding resin of the upper film and a second thermal bonding resin of the lower film, a first air gap is formed between the conductive wires, a second air gap is formed by removing the first thermal bonding resin on a partial upper surface of each of the conductive wires, a third air gap is formed by removing the second thermal bonding resin on a partial lower surface of each of the conductive wires, and a side end of the upper film and a side end of the lower film are bonded by the first thermal bonding resin and the second thermal bonding resin.

The conductive wires may have a height higher than a sum of a thickness of the first thermal bonding resin and a thickness of the second thermal bonding resin, an upper surface of the first air gap may be formed at a position higher than the upper surface of the conductive wires, and a lower surface of the first air gap may be formed at a position lower than the lower surface of the conductive wires.

According to still another example of the present invention, there is provided a flexible flat cable including a plurality of circular conductive wires disposed between an upper film and a lower film, wherein the circular conductive wires are fixed by a first thermal bonding resin of the upper film and a second thermal bonding resin of the lower film, the first thermal bonding resin of the upper film and the second thermal bonding resin of the lower film are partially removed to form an air gap between the circular conductive wires such that the air gap is shielded from the circular conductive wires, and a side end of the upper film and a side end of the lower film are bonded to each other by the first thermal bonding resin and the second thermal bonding resin.

According to these embodiments, the flexible flat cable according to the present invention can minimize the loss (which is called the transmission data loss, or the decrease in the transmission data rate) of data transmitted through the conductive wires, and prevent the plating solution from entering the air gap formed between the conductive wires when plating the exposed connection end of the conductive wires, by sealing the air gap formed at the end portions of the upper film and the lower film.

BRIEF DESCRIPTION OF THE DRAWINGS

FIG. 1 is a plan view showing a flexible flat cable according to the present invention.

FIG. 2 is a sectional view taken along line A-A in FIG. 1, and showing a flexible flat cable according to a first embodiment of the present invention.

FIG. 3 is a sectional view taken along line A-A in FIG. 1, and showing a flexible flat cable according to a second embodiment of the present invention.

FIG. 4 is a sectional view showing the flexible flat cable according to the second embodiment of the present invention, in which an air gap is divided into a plurality of air gaps.

FIG. 5 is a sectional view taken along line A-A in FIG. 1, and showing a flexible flat cable according to a third embodiment of the present invention.

FIG. 6 is a sectional view showing the flexible flat cable according to the third embodiment of the present invention, an air gap is divided into a plurality of air gaps.

FIG. 7 is an enlarged sectional view taken along line A-A in FIG. 1, and showing an example in which air gaps are formed.

FIG. 8 is a sectional view taken along line A-A in FIG. 1, in which a sectional shape of conductive wires is a circle, FIG. 8(a) is a sectional view corresponding to the sectional view of FIG. 2, FIG. 8(b) is a sectional view corresponding to the sectional view of FIG. 3, FIG. 8(c) is a sectional view corresponding to the sectional view of FIG. 4, FIG. 8(d) is a sectional view corresponding to the sectional view of FIG. 5, and FIG. 8(e) is a sectional view corresponding to the sectional view of FIG. 6.

FIG. 9 is a sectional view taken along line A-A in FIG. 1, and showing examples, in which an impedance matching film is attached to the flexible flat cable shown in the sectional view of FIG. 2.

FIG. 10 is a sectional view taken along line B-B in FIG. 1, and showing a first embodiment for preventing a plating solution from entering an air gap in the flexible flat cable according to the present invention.

FIG. 11 is an enlarged detail view showing portion (I) in FIG. 10.

FIG. 12 is a partially enlarged detail view showing a section taken along line C-C in FIG. 10.

FIG. 13 is a sectional view taken along line B-B in FIG. 1, and showing a second embodiment for preventing the plating solution from entering the air gap in the flexible flat cable according to the present invention.

FIG. 14 is an enlarged detail view showing portion (II) in FIG. 13.

FIG. 15 is a partially enlarged detail view showing a section taken along line D-D in FIG. 13.

FIG. 16 is a sectional view taken along line B-B in FIG. 1, and showing a third embodiment for preventing the plating solution from entering the air gap in the flexible flat cable according to the present invention.

FIG. 17 is an enlarged detail view showing portion (III) in FIG. 16.

FIG. 18 is a partially enlarged detailed perspective view showing portion (III) in FIG. 16.

FIG. 19 is a sectional view taken along line B-B in FIG. 1, and showing a fourth embodiment for preventing the plating solution from entering the air gap in the flexible flat cable according to the present invention.

FIG. 20 is an enlarged detail view showing portion (IV) in FIG. 19.

FIG. 21 is a partially enlarged detailed perspective view showing portion (IV) in FIG. 19.

FIG. 22 is a sectional view taken along line B-B in FIG. 1, and showing a fifth embodiment for preventing the plating solution from entering the air gap in the flexible flat cable according to the present invention.

FIG. 23 is an enlarged detail view showing portion (V) in FIG. 22.

FIG. 24 is a partially enlarged detail view showing a section taken along line e-e in FIG. 22.

FIG. 25 is a sectional view taken along line B-B in FIG. 1, and showing a sixth embodiment for preventing the plating solution from entering the air gap in the flexible flat cable according to the present invention.

FIG. 26 is an enlarged detail view showing portion (VI) in FIG. 25.

FIG. 27 is a partially enlarged detail view showing a section taken along line f-f in FIG. 25.

FIG. 28 is a sectional view taken along line B-B in FIG. 1, and showing a seventh embodiment for preventing the plating solution from entering the air gap in the flexible flat cable according to the present invention.

FIG. 29 is an enlarged detail view showing portion (VII) in FIG. 28.

FIG. 30 is a partially enlarged detail view showing a section taken along line g-g in FIG. 28.

FIG. 31 is a plan view showing a flexible flat cable according to another example of the present invention.

FIG. 32 is a sectional view taken along line A-A in FIG. 31.

FIG. 33 is an enlarged sectional view showing portion (I) in FIG. 32.

FIG. 34 is a perspective view of the flexible flat cable, showing portion (I) in FIG. 32.

FIG. 35 is a sectional view of the flexible flat cable, taken along line B-B in FIG. 31.

FIG. 36a to FIG. 36c are views showing examples in which the impedance matching film is attached to upper and lower surfaces of the flexible flat cable shown in FIG. 35.

FIG. 37 is a sectional view of the flexible flat cable, taken along line C-C in FIG. 31.

FIG. 38 is a plan view showing a flexible flat cable according to still another example of the present invention.

FIG. 39 is a sectional view taken along line A-A in FIG. 38.

FIG. 40 is an enlarged sectional view showing portion (II) in FIG. 39.

FIG. 41 is a perspective view of the flexible flat cable, showing portion (II) in FIG. 39.

FIG. 42 is a sectional view of the flexible flat cable, taken along line B-B in FIG. 38.

FIG. 43a to FIG. 43c are views showing examples in which the impedance matching film is attached to upper and lower surfaces of the flexible flat cable shown in FIG. 42.

FIG. 44 is a sectional view showing the flexible flat cable, taken along line C-C in FIG. 38.

DETAILED DESCRIPTION OF THE EMBODIMENTS

Hereinafter, embodiments of the present invention will be described in detail with reference to the accompanying drawings.

First, referring to FIG. 1 and FIG. 2, a flexible flat cable according to a first embodiment of the present invention includes a plurality of conductive wires 15 disposed between an upper film 11 and a lower film 13, wherein the conductive wires 15 are fixed by a first thermal bonding resin 12 of the upper film 11 and a second thermal bonding resin 14 of the lower film 13, an air gap 16 is formed between the conductive wires 15, and a side end of the upper film 11 and a side end of the lower film 13 are bonded by the first thermal bonding resin 12 and the second thermal bonding resin 14.

Referring to FIG. 1 and FIG. 3, a flexible flat cable according to a second embodiment of the present invention includes a plurality of conductive wires 15 disposed between an upper film 11 and a lower film 13, wherein the conductive wires 15 are fixed by a first thermal bonding resin 12 applied to a lower surface of the upper film 11, an air gap 16 is formed between the conductive wires 15 and between the lower film 13 and the conductive wire 15, and a side end of the upper film 11 and a side end of the lower film 13 are bonded by the first thermal bonding resin 12.

Referring to FIG. 4, the air gap 16 may be divided into a plurality of air gaps 16a, 16b, 16c, . . . by a plurality of partition portions 12a formed at the first thermal bonding resin 12 and arranged between the conductive wires 15.

Referring to FIG. 1 and FIG. 5, a flexible flat cable according to a third embodiment of the present invention includes a plurality of conductive wires 15 disposed between an upper film 11 and a lower film 13, wherein the conductive wires 15 are fixed by a second thermal bonding resin 14 applied to the lower film 13, an air gap 16 is formed between the conductive wires 15 and between the upper film 11 and the conductive wire 15, and a side end of the upper film 11 and a side end of the lower film 13 are bonded by the second thermal bonding resin 14.

Referring to FIG. 6, the air gap 16 may be divided into a plurality of air gaps 16d, 16b', 16c', . . . by a plurality of partition portions 14a formed at the second thermal bonding resin 14 and arranged between the conductive wires 15.

Referring to FIG. 7, the air gap 16 may be formed between signal transmission lines 15a and 15b for transmitting signals, and a thermal bonding resin may be filled between the signal transmission line 15a or 15b and a ground line 15c and between ground lines 15c.

The flexible flat cable according to the first to third embodiments of the present invention as described above may minimize loss of data transmitted through conductive wires 15, that is, transmission data loss (decrease in a transmission data rate), by forming an air gap 16 between the conductive wires 15. In general, it is known that the transmission data loss is increased as a dielectric constant of a material surrounding the conductive wires 15 becomes higher, and air has the lowest dielectric constant, so that the transmission data loss can be reduced more by arranging the air gap 16 around the conductive wires 15 rather than surrounding a periphery of the conductive wires 15 with the thermal bonding resin.

Referring again to FIG. 2, in the flexible flat cable according to the first embodiment of the present invention, the conductive wires 15 may have a height h1 larger than a sum of a thickness t2 of the first thermal bonding resin 12 and a thickness t3 of the second thermal bonding resin 14, so that the air gap 16 is formed between the conductive wires 15. The first thermal bonding resin 12 and the second thermal bonding resin 14 may be hot-melt films.

Referring to FIG. 2 and FIGS. 8(a)-8(e), the conductive wires 15 may have a rectangular sectional shape as shown in FIG. 2, or a circular sectional shape as shown in FIGS. 8(a)-8(e).

Referring to FIG. 9, in the flexible flat cable according to the first to third embodiments of the present invention, the flexible flat cable may have an impedance matching sheet 20 attached to a lower surface of the lower film 13 as shown in FIG. 9(a), an upper portion of the upper film 11 as shown in FIG. 9(b), or both the upper portion of the upper film 11 and the lower surface of the lower film 13 as shown in FIG. 9(c). The impedance matching sheet 20 serves to prevent the transmission loss due to a decrease in capacitance, by matching an impedance of the conductive wires 15.

In the flexible flat cable according to the first embodiment of the present invention, the measures to prevent a plating solution from entering the air gap 16 in a plating process are as follows.

Referring to FIG. 10 to FIG. 12, in the flexible flat cable according to the first to third embodiments of the present invention, there is provided a plating solution inflow prevention structure of the flexible flat cable according to a first embodiment of the present invention, wherein a length L1 of the conductive wires 15 may be equal to a length of the lower film 13, so that an end portion of the conductive wires 15 matches with an end portion of the lower film 13, the length L1 of the conductive wires 15 may be longer than a length L2 of the upper film 11, so that an exposed connection end 17a of the conductive wires 15 is exposed outward from an end portion of the upper film 11, a lower horizontal portion 18a of a cover film 18 may be bonded to the exposed connection end 17a of the conductive wires 15 at the end portion of the upper film 11, and an upper horizontal portion 18b of the cover film 18 may be bonded to the upper film 11, so that the air gap is filled with an adhesive 19 thickly applied to the cover film 18 as shown in FIG. 12 so as to prevent a plating solution from entering the air gap 16 (see FIG. 2) in a plating process, and the adhesive 19 of the cover film 18 and the second thermal bonding resin 14 of the lower film 13 may be bonded to surround the conductive wires 15.

Reference numeral 25, which is not explained, in FIG. 11 and FIG. 12 is a first reinforcing plate attached to the lower surface of the lower film 13.

Accordingly, the plating solution inflow prevention structure of the flexible flat cable according to the first embodiment of the present invention may prevent the plating solution from entering the air gap 16 and being filled in the air gap 16 between the upper film 11 and the lower film 13 in the process of plating the conductive wires exposed at the exposed connection end 17a of the conductive wires 15.

Referring to FIG. 13 to FIG. 15, in the flexible flat cable according to the first to third embodiments of the present invention, there is provided a plating solution inflow prevention structure of the flexible flat cable according to a second embodiment of the present invention, wherein a length L1 of conductive wires 15 may be longer than a length L2 of the upper film 11 and a length L3 of the lower film 13, so that an exposed connection end 17b of the conductive wires 15 is exposed outward from an end portion of the upper film 11 and an end portion of the lower film 13, and the length L2 of the upper film 11 may be longer than the length L3 of the lower film 13. A second reinforcing plate 30 may be simultaneously bonded to a lower surface of the exposed connection end 17b and the end portion of the lower film 13, a part of the second reinforcing plate 30 may overlap with the end portion of the upper film 11, and the air gap may be filled with an adhesive 32 thickly applied to the second reinforcing plate 30 as shown in FIG. 15 so as to prevent a plating solution from entering the air gap 16 (see FIG. 2) in a plating process, and the adhesive 32 and the first thermal bonding resin 12 of the upper film 11 may be bonded to surround a periphery of the conductive wires 15 at the exposed connection end 17b.

Accordingly, the flexible flat cable according to the present invention may prevent the plating solution from entering the air gap 16 (see FIG. 2) and being filled in the air gap 16 between the upper film 11 and the lower film 13 in the process of plating the conductive wires exposed at the exposed connection end 17b of the conductive wires 15.

Referring to FIG. 16 to FIG. 18, in the flexible flat cable according to the first to third embodiments of the present invention, there is provided a plating solution inflow prevention structure of the flexible flat cable according to a third embodiment of the present invention, wherein a length L1 of the conductive wires 15 may be equal to a length of the lower film 13, so that an end portion of the conductive wires 15 matches with an end portion of the lower film 13, the length L1 of the conductive wires 15 may be longer than a length L2 of the upper film 11, so that an exposed connection end 17c of the conductive wires 15 is exposed outward from an end portion of the upper film 11, a thermal-pressed end 11a for pressing the air gap may be formed at the end portion of the upper film 11 as shown in FIG. 18 by thermally pressing the end portion of the upper film 11 so as to prevent a plating solution from entering the air gap 16 (see FIG. 2) in a plating process, and the first thermal bonding resin 12 applied to the thermal-pressed end 11a of the upper film 11 and the second thermal bonding resin 14 of the lower film 13 may be bonded to each other so as to surround a periphery of the conductive wires 15. Reference numeral 25, which is not explained, in FIG. 17 and FIG. 18 is a first reinforcing plate attached to the lower surface of the lower film 13.

Accordingly, the flexible flat cable according to the present invention may prevent the plating solution from entering the air gap 16 and being filled in the air gap 16 between the upper film 11 and the lower film 13 in the process of plating the conductive wires exposed at the exposed connection end 17c of the conductive wires 15.

Referring to FIG. 19 to FIG. 21, in the flexible flat cable according to the first to third embodiments of the present invention, there is provided a plating solution inflow prevention structure of the flexible flat cable according to a fourth embodiment of the present invention, wherein a length L1 of the conductive wires 15 may be longer than a length L2 of the upper film 11 and a length L3 of the lower film 13, so that an exposed connection end 17d of the conductive wires 15 is exposed outward from an end portion of the upper film 11 and an end portion of the lower film 13, the length L2 of the upper film 11 may be longer than the length L3 of the lower film 13, a second reinforcing plate 30 may be bonded to a lower surface of the exposed connection end 17d and the end portion of the lower film 13, and a thermal-pressed end 11a for pressing the air gap may be formed at the end portion of the upper film 11 as shown in FIG. 21 by thermally pressing the end portion of the upper film 11 so as to prevent a plating solution from entering the air gap 16 (see FIG. 2) in a plating process, and the first thermal bonding resin 12 applied to the thermal-pressed end 11a of the upper film 11 and an adhesive 32 of the second reinforcing plate 30 may be bonded to each other so as to surround a periphery of the conductive wires 15.

Accordingly, the flexible flat cable according to the present invention may prevent the plating solution from entering the air gap 16 (see FIG. 2) and being filled in the air gap 16 between the upper film 11 and the lower film 13 in the process of plating the conductive wires exposed at the exposed connection end 17d of the conductive wires 15.

Referring to FIG. 22 to FIG. 24, in the flexible flat cable according to the first to third embodiments of the present invention, there is provided a plating solution inflow prevention structure of the flexible flat cable according to a fifth embodiment of the present invention, wherein a length L1 of the conductive wires 15 may be equal to a length of the lower film 13, so that an end portion of the conductive wires 15 is matched with an end portion of the lower film 13, the length L1 of the conductive wires 15 may be longer than a length L2 of the upper film 11, so that an exposed connection end 17e of the conductive wires 15 is exposed outward from an end portion of the upper film 11. An air gap prevention film 40 may be attached to an upper surface of the exposed connection end 17e at the end portion of the upper film 11, a part of the air gap prevention film 40 may be covered with a cover end portion 11b of the upper film 11, and the air gap may be filled with an adhesive 42 thickly applied to the air gap prevention film 40 as shown in FIG. 24 so as to prevent a plating solution from entering the air gap 16 (see FIG. 2) in a plating process, and the adhesive 42 of the air gap prevention film 40 and the second thermal bonding resin 14 of the lower film 13.

Referring to FIG. 25 to FIG. 27, in the flexible flat cable according to the first to third embodiments of the present invention, there is provided a plating solution inflow prevention structure of the flexible flat cable according to a sixth embodiment of the present invention, wherein a length L1 of the conductive wires 15 may be longer than a length L2 of the upper film 11 and a length L3 of the lower film 13, so that an exposed connection end 17f of the conductive wires 15 is exposed outward from an end portion of the upper film 11 and an end portion of the lower film 13, the length L2 of the upper film 11 may be longer than the length L3 of the lower film 13. An air gap prevention film 40 may be attached to a lower surface of the exposed connection end 17f at the end portion of the lower film 13, a part of the air gap prevention film 40 may be covered with a cover end portion 13b of the lower film 13, and the air gap may be filled with an adhesive 42 thickly applied to the air gap prevention film 40 as shown in FIG. 27 so as to prevent a plating solution from entering the air gap 16 (see FIG. 2) in a plating process, and the adhesive 42 of the air gap prevention film 40 and the first thermal bonding resin 12 of the upper film 11 may be bonded to surround the conductive wires 15.

Referring to FIG. 28 to FIG. 30, in the flexible flat cable according to the first to third embodiments of the present invention, there is provided a plating solution inflow prevention structure of the flexible flat cable according to a seventh embodiment of the present invention, wherein a length L1 of the conductive wires 15 may be longer than a length L2 of the upper film 11 and a length L3 of the lower film 13, so that an exposed connection end 17g of the conductive wires 15 is exposed outward from an end portion of the upper film 11 and an end portion of the lower film 13, the length L2 of the upper film 11 may be equal to the length L3 of the lower film 13. A thermal-pressed end 11a for pressing the air gap may be formed at the end portion of the upper film 11, and a thermal-pressed end 13a for pressing the air gap may be formed at the end portion of the lower film 13 as shown in FIG. 30 by heat-pressing the end portion of the upper film 11 and the end portion of the lower film 13 so as to prevent a plating liquid from entering the air gap 16 (see FIG. 2) in a plating process. The first thermal bonding resin 12 applied to the thermal-pressed end 11a of the upper film 11 and the second thermal bonding resin 14 applied to the thermal-pressed end 13a of the lower film 13 may be bonded to surround the conductive wires 15, and the second reinforcing plate 30 may be bonded to a lower surface of the exposed connection end 17g and the heat-pressed end 13a of the lower film 13 by an adhesive 32.

Meanwhile, a flexible flat cable according to another example of the present invention will be described with reference to FIG. 31 and FIG. 37.

As shown in FIG. 31 and FIG. 35, a plurality of conductive wires 115 are disposed between an upper film 111 and a lower film 113, and there is provided an air gap region 150 having air gaps formed in a stripe shape between the conductive wires 115 or between upper and lower surfaces of each of the conductive wires 115 while being spaced apart from exposed connection ends 115a on both ends of the conductive wires 115 by a distance of d. The conductive wires 115 are fixed by a first thermal bonding resin 112 of the upper film 111 and a second thermal bonding resin 114 of the lower film 113, a first air gap 116 is formed between the conductive wires 115 in the air gap region, and a side end of the upper film 111, upper and lower side ends of the lower film 113, and a region corresponding to distance d are bonded by the first thermal bonding resin 112 and the second thermal bonding resin 114. In addition, a second air gap 126 is formed between a lower surface of the upper film 111 and the upper surface of the conductive wires 115 by partially removing the first thermal bonding resin 112 bonded with the upper surface of each of the conductive wires 115 in the air gap region in the stripe shape, and a third air gap 136 is formed between an upper surface of the lower film 111 and the lower surface of the conductive wires 115 by partially removing the second thermal bonding resin 114 bonded with the lower surface of each of the conductive wires 115.

The first thermal bonding resin 112 and the second thermal bonding resin 114 disposed on the upper and lower surfaces of the first air gap 116 may be partially scraped and removed in the stripe shape to form the second air gap 126 and the third air gap 136.

The first thermal bonding resin 112 and the second thermal bonding resin 114 disposed on the upper and lower surfaces of the first air gap 116 may be removed to enlarge the volume of the first air gap 116. That is, the volume of the first air gap 116 may be enlarged by forming the upper surface of the first air gap 116 at a position higher than the upper surface of the conductive wires 115, and the lower surface of the first air gap 116 at a position lower than the lower surface of the conductive wires 115.

The flexible flat cable according to the present invention as described above may minimize loss of data transmitted through conductive wires 115, that is, transmission data loss (decrease in a transmission data rate), by forming the first air gap 116 between the conductive wires 115, the second air gap 126 between the lower surface of the upper film 111 and the upper surface of the conductive wires 115, and the third air gap 136 between the upper surface of the lower film 111 and the lower surface of the conductive wires 115.

In general, it is known that the transmission data loss is increased as a dielectric constant of a material surrounding the conductive wires 115 becomes higher, and air has the lowest dielectric constant, so that the transmission data loss can be reduced more by arranging the air gaps 116, 126, and 136 around the conductive wires 115 rather than surrounding a periphery of the conductive wires 115 with the thermal bonding resin.

Referring again to FIG. 35, in the flexible flat cable according to another example of the present invention, the conductive wires 115 may have a height h1 larger than a sum of a thickness t2 of the first thermal bonding resin 112 and a thickness t3 of the second thermal bonding resin 114, the upper surface of the first air gap 116 may be formed at a position higher than the upper surface of the conductive wires 115, and the lower surface of the first air gap 116 may be formed at a position lower than the lower surface of the conductive wires 115. The first thermal bonding resin 112 and the second thermal bonding resin 114 may be hot-melt films.

Referring to FIG. 36, in the flexible flat cable according to the present invention, the flexible flat cable may have an impedance matching sheet 120 attached to a lower surface of the lower film 113 as shown in FIG. 36a, an upper portion of the upper film 111 as shown in FIG. 36b, or both the upper portion of the upper film 111 and the lower surface of the lower film 113 as shown in FIG. 36c. The impedance matching sheet 120 serves to prevent the transmission loss due to a decrease in capacitance, by matching an impedance of the conductive wires 115.

In a flexible flat cable according to another example of the present invention, a structure for preventing a plating solution from entering inner conductive wires and the air gaps 116, 126, and 136 in a plating process for an exposed end portion of the conductive wires 115 will be described with reference to FIG. 32 to FIG. 34, and FIG. 37.

According to another example of the present invention, there is provided a plating solution inflow prevention structure of the flexible flat cable, wherein a length of the conductive wires 115 may be equal to a length of the lower film 113, so that an end portion of the conductive wires 115 matches with an end portion of the lower film 113, and the length L1 of the conductive wires 115 may be longer than a length L2 of the upper film 111, so that an exposed connection end 115a of the conductive wires 115 is exposed outward from an end portion of the upper film 111.

In addition, there is provided a structure in which air gaps are not formed at upper and lower side ends of the upper and lower films 111 and 113 and the end portion of the upper film 111 by a width of d, so as to prevent the plating solution from entering the air gaps 116, 126, and 136 (see FIG. 35) in the plating process for the exposed connection end 115a of the conductive wires, and maintain the reliability on adhesion of the upper and lower films 111 and 113. In other words, as shown in FIG. 34 and FIG. 37, the upper and lower films 111 and 113 may be thermally pressed, so that the first thermal bonding resin 112, which is formed of a hot-melt film, of the upper film 111 and the second thermal bonding resin 114 of the lower film 113 may completely seal and surround a periphery of the conductive wires 115.

Reference numeral 125, which is not explained, in FIG. 33, FIG. 34 and FIG. 37 is a reinforcing plate attached to the lower surface of the lower film 113. The reinforcing plate 125 serves to reinforce the strength of the cable so that the connection end can be easily inserted without being bent when the exposed connection end 115a of the conductive wires is inserted into a connector (not shown) for connection.

Accordingly, the plating solution inflow prevention structure of the flexible flat cable according to the present invention may prevent the plating solution from entering the first air gap 116, the second air gap 126, and the third air gap 136, and being filled in the first air gap 116 formed between the upper film 111 and the lower film 113, the second air gap 126 formed between the lower surface of the upper film 111 and the upper surface of the conductive wires 115, and the third air gap 136 formed between the upper surface of the lower film 111 and the lower surface of the conductive wires 115 in the process of plating the exposed connection end 115a of the conductive wires 115.

In addition, a flexible flat cable according to another example of the present invention will be described with reference to FIG. 38 to FIG. 44.

First, referring to FIG. 38 to FIG. 41, in a flexible flat cable of still another example of the present invention, a plurality of circular conductive wires 1115 are disposed between an upper film 111 and a lower film 113, and exposed connection ends 1115a on both ends of the conductive wires 1115 are arranged with flat conductive wires to increase the area connected to the connector (not shown). There is provided an air gap region 1150 having air gaps 1116 formed in a stripe shape between the circular conductive wires 1115 while being spaced apart from the exposed connection ends 1115a by a distance of d.

Referring to FIG. 42, a plurality of circular conductive wires 1115 are disposed between an upper film 111 and a lower film 113, the circular conductive wires 1115 are fixed by a first thermal bonding resin 112 of the upper film 111 and a second thermal bonding resin 114 of the lower film 113, an air gap 1116 is formed between the conductive wires 1115, and a side end of the upper film 111 and a side end of the lower film 113 are bonded by the first thermal bonding resin 112 and the second thermal bonding resin 114. The air gap 1116 may be formed by partially scraping and removing the first thermal bonding resin 112 of the upper film 111 and the second thermal bonding resin 114 of the lower film 113 in the stripe shape, and bonding the first thermal bonding resin 112 of the upper film 111 and the second thermal bonding resin 114 of the lower film 113 to each other.

In addition, the air gap 1116 may be completely separated and shielded from the conductive wires 1115. The flexible flat cable according to still another example of the present invention as described above may minimize loss of data transmitted through conductive wires 1115, that is, transmission data loss (decrease in a transmission data rate), by forming an air gap 1116 between the conductive wires 1115.

Referring to FIG. 43, the flexible flat cable according to still another example of the present invention may have an impedance matching sheet 120 attached to a lower surface of the lower film 113 as shown in FIG. 43a, an upper portion of the upper film 111 as shown in FIG. 43b, or both the upper portion of the upper film 111 and the lower surface of the lower film 113 as shown in FIG. 43c.

The impedance matching sheet 120 serves to prevent the transmission loss due to a decrease in capacitance, by matching an impedance of the circular conductive wires 1115.

In the flexible flat cable according to still another example of the present invention, a structure for preventing a plating solution from entering inner conductive wires and the air gaps 1116 in a plating process for an exposed end portion of the conductive wires 1115 will be described with reference to FIG. 39 to FIG. 41, and FIG. 44.

In the structure for preventing the plating solution from entering the inner conductive wires and the air gaps 1116 in the plating process for the exposed end portion of the conductive wires 1115, a length of the conductive wires 1115 may be equal to a length of the lower film 113, so that an end portion of the conductive wires 1115 matches with an end portion of the lower film 113, and the length L1 of the conductive wires 1115 may be longer than a length L2 of the upper film 111, so that an exposed connection end 1115a of the conductive wires 1115 is exposed outward from an end portion of the upper film 111.

In addition, there is provided a structure in which air gaps are not formed at upper and lower side ends of the upper and lower films 111 and 113 and the end portion of the upper film 111 by a distance of d, so as to prevent the plating solution from entering the air gaps 1116 (see FIG. 38 and FIG. 42) in the plating process for the exposed connection end 1115a of the conductive wires, and maintain the reliability on adhesion of the upper and lower films 111 and 113. In other words, as shown in FIG. 41 and FIG. 4, the upper and lower films 111 and 113 may be thermally pressed, so that the first thermal bonding resin 112, which is formed of a hot-melt film, of the upper film 111 and the second thermal bonding resin 114 of the lower film 113 may completely seal and surround a periphery of the conductive wires 1115.

The present invention is not limited to description and drawing structures of the embodiments described above, and various modifications made by those skilled in the art without departing from the spirit of the invention should be included in the scope of the disclosed claims of the present invention.

What is claimed is:

1. A flexible flat cable comprising:
a plurality of conductive wires disposed between an upper film and a lower film,
wherein the conductive wires are fixed by a first thermal bonding resin of the upper film and a second thermal bonding resin of the lower film, a first air gap is formed between the conductive wires, a second air gap is formed on the first thermal bonding resin on a partial upper surface of each of the conductive wires, a third air gap is formed on the second thermal bonding resin on a partial lower surface of each of the conductive wires, and a side end of the upper film and a side end of the lower film are bonded by the first thermal bonding resin and the second thermal bonding resin, and
wherein the first air gap is separated from the second air gap and the third air gap.

2. The flexible flat cable of claim 1, wherein the conductive wires have a height higher than a sum of a thickness of the first thermal bonding resin and a thickness of the second thermal bonding resin, an upper surface of the first air gap is formed at a position higher than the upper surface of the conductive wires, and a lower surface of the first air gap is formed at a position lower than the lower surface of the conductive wires.

3. The flexible flat cable of claim 1, wherein the first thermal bonding resin and the second thermal bonding resin are hot-melt films.

4. The flexible flat cable of claim 1, wherein the second air gap is completely surrounded by the upper film, the first thermal bonding resin and the partial upper surface of each of the conductive wires.

5. The flexible flat cable of claim 1, wherein the third air gap is completely surrounded by the lower film, the second thermal bonding resin and the partial lower surface of each of the conductive wires.

6. The flexible flat cable of claim 1, wherein the first air gap extends between the upper film and the lower film.

7. The flexible flat cable of claim 1, wherein the second air gap and the third air gap are self-contained air gaps.

8. The flexible flat cable of claim 1, wherein the first air gap does not contact the second air gap and the third air gap.

* * * * *